US007868949B2

(12) United States Patent
Moehlmann et al.

(10) Patent No.: US 7,868,949 B2
(45) Date of Patent: Jan. 11, 2011

(54) CIRCUIT ARRANGEMENT AND METHOD FOR LOCKING ONTO AND/OR PROCESSING DATA, IN PARTICULAR AUDIO, T[ELE]V[ISION] AND/OR VIDEO DATA

(75) Inventors: Ulrich Moehlmann, Moisburg (DE); Andreas Szaj, Hamburg (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 1099 days.

(21) Appl. No.: 10/580,672

(22) PCT Filed: Dec. 6, 2004

(86) PCT No.: PCT/IB2004/052671

§ 371 (c)(1),
(2), (4) Date: Jun. 14, 2006

(87) PCT Pub. No.: WO2005/060105

PCT Pub. Date: Jun. 30, 2005

(65) Prior Publication Data

US 2009/0244375 A1     Oct. 1, 2009

(30) Foreign Application Priority Data

Dec. 15, 2003    (EP) .................................. 03104685

(51) Int. Cl.
*H03L 7/00* (2006.01)
(52) U.S. Cl. ..................................... 348/536; 327/156
(58) Field of Classification Search ......... 348/536–549, 348/512, 515; 375/373–376; 327/141–163
See application file for complete search history.

(56) References Cited

U.S. PATENT DOCUMENTS 5,065,115 A     11/1991    Pletz-Kirsch et al.
5,511,100 A      4/1996    Lundberg et al.

(Continued)

FOREIGN PATENT DOCUMENTS

EP          0 619 653         10/1994

(Continued)

OTHER PUBLICATIONS

Best, Roland E.: "Theorie and Anwendung des Phase Locked Loop", English transaction AT-publishing company, 1993.

(Continued)

*Primary Examiner*—M. Lee
(74) *Attorney, Agent, or Firm*—DLA Piper LLP (US)

(57) ABSTRACT

In order to further develop a circuit arrangement (100; 102; 104; 106) and a method of locking onto and/or processing data, in particular audio, television and/or video data, by means of at least one phase locked loop (40), wherein phase information is detected by means of at least one phase detector (44), in particular following the arrival of at least one rising edge and/or falling edge of at least one analog input signal (50; 50), at least one increment (24) is determined by means of at least one loop filter (30), to which the output signal (56) which is output by the phase detector (44) is fed, and at least one ramp oscillator (46) is fed the increment (24) which is output by the loop filter (30), such that inter alia the circuit arrangement (100; 102; 104; 106).

15 Claims, 10 Drawing Sheets

U.S. PATENT DOCUMENTS

| | | |
|---|---|---|
| 6,320,574 B1 | 11/2001 | Eglit |
| 6,353,647 B1 | 3/2002 | Wilhelmsson et al. |
| 6,826,247 B1 * | 11/2004 | Elliott et al. ............ 375/376 |
| 6,993,109 B2 * | 1/2006 | Lee et al. ............... 375/376 |
| 2002/0191727 A1 | 12/2002 | Staszewkski |
| 2003/0052997 A1 | 3/2003 | Renner |

FOREIGN PATENT DOCUMENTS

| | | |
|---|---|---|
| JP | 03-103636 | 10/1991 |
| JP | 06-112814 | 4/1994 |
| JP | 09-121146 | 5/1997 |
| JP | 10-190408 | 7/1998 |
| JP | 2000-100083 | 4/2000 |
| JP | 2002-033660 | 1/2002 |
| JP | 2003-023352 | 1/2003 |
| WO | WO 03/081779 | 10/2003 |
| WO | WO 03/081779 | 6/2010 |

OTHER PUBLICATIONS

Lunze, Jan: "Regelungstechnik", English Translation, Publishing company: Springer, 1996.

* cited by examiner

CIRCUIT ARRANGEMENT AND METHOD FOR LOCKING ONTO AND/OR PROCESSING DATA, IN PARTICULAR AUDIO, T[ELE]V[ISION] AND/OR VIDEO DATA

The present invention relates to a circuit arrangement having at least one phase locked loop, comprising
 at least one phase detector for detecting phase information of at least one analog input signal, in particular following the arrival of at least one rising edge and/or falling edge of at least one analog input signal,
 at least one loop filter, to which the output signal which is output by the phase detector can be fed, for determining at least one increment, and
 at least one ramp oscillator, to which the increment output by the loop filter can be fed.

The present invention furthermore relates to a method of locking onto and/or processing data, in particular audio, T[ele]V[ision] and/or video data, by means of at least one phase locked loop, wherein
 phase information is detected by means of at least one phase detector, in particular following the arrival of at least one rising edge and/or falling edge of at least one analog input signal,
 at least one increment is determined by means of at least one loop filter, to which the output signal which is output by the phase detector is fed, and
 at least one ramp oscillator is fed with the increment output by the loop filter.

The structures of integrated circuits (so-called I[ntegrated] C[ircuit]s) are becoming ever smaller and more complex as technologies improve. This opens up the possibility of placing higher and higher requirements on a system and combining more and more functions in one integrated circuit.

Since the development of such complex systems is very cost-intensive, it is extremely important to be able to offer the product on the market as soon as possible in order to be able to cover the resulting costs. For this reason, attempts are made to keep development times as short as possible. A starting point for shortening development times is a database which is as flexible as possible and can be used universally.

In this connection, the generation of clock signals with a certain frequency ratio and with a constant phase relationship to the input signal is necessary for a large number of applications. For this purpose, use is generally made of phase locked loops (so-called P[hase]L[ocked]L[oop]s). A phase locked loop is a special circuit for producing desired frequency and phase relationships with a certain accuracy; the accuracy with which the circuit operates depends on the need and control behavior of the circuit.

A common field of application of a P[hase]L[ocked]L[oop] is television technology. In order for the viewer to see a clear television image on his television set, it is necessary to synchronize the deflector unit of the picture tube with the transmitted image in a manner that is correct in terms of frequency and phase; this is carried out by means of a P[hase]L[ocked]L[oop].

A P[hase]L[ocked]L[oop] is accordingly a control system, the aim of which is to synchronize an oscillator with an input signal in terms of frequency and phase. In the synchronized state, the phase difference between input signal and oscillator signal is zero or constant. In the event of a phase shift of input signal and oscillator signal relative to one another, the P[hase]L[ocked]L[oop] readjusts the oscillator until the phase shift has disappeared again or is constant.

In applications based on T[ele]V[ision], the horizontal synchronization signal or line synchron(ization) signal (so-called "hsync" signal) is often the reference signal from which a clock signal is derived, the frequency of which clock signal is a multiple, for example 2.048 times, the input frequency or parts thereof.

If the application considered is not an application based on T[ele]V[ision] or video but rather another application, for example based on audio, the reference signal is often a general signal which can be referred to as the "bin" signal:

Thus, in applications based on audio, the so-called "W[ord]S[elect]" signal is often the reference signal for the bit-wise clock for transmitting the data. Here, the "W[ord]S[elect]" signal is the signal for channel differentiation in the serial transmission of audio data in the I[nter]I[ntegratedCircuit]S[ound] format (so-called IIS format or $I^2S$ format); this means that the "W[ord]S[elect]" signal indicates, by means of the high or low state, whether the left channel or the right channel is being used.

In the past, use has been made, both for T[ele]V[ision] applications and for audio applications, of analog P[hase]L[ocked]L[oop] systems with which clock signals can be provided in the order of magnitude of less than three hundred Megahertz for input frequencies in the range from about fifteen Kilohertz to about sixty Kilohertz. For new V[ery]L[arge]S[cale]I[ntegration] processes, there is a need for a new digital low-frequency PLL which can be used in a more flexible manner than an analog system.

Recently, use has been made mainly of digital PLL systems for example because
 the properties required by the market or by consumers or customers cannot (any longer) be satisfied by analog PLL systems,
 analog systems are very sensitive to interference, such as "ground bounce" (=fluctuations in the reference voltage on account of switching operations), or
 digital PLL systems can be scaled to smaller processes without any loss in terms of performance.

This therefore provides a reason as to why the analog part of phase locked loop systems should be reduced as far as possible, and moreover the following necessary properties can be obtained only with great difficulty or not at all by analog PLL systems:
 without an input signal or with the input signal switched off, the system remains at its last frequency, for example to bring about a monitor mode;
 when the control loop is opened and the system is switched to its nominal frequency (or vice versa), this should take place in a smooth manner which is continuous over time, with a limited and adaptable frequency change; if the line frequency in television sets changes too quickly, the E[xtremely]H[igh]T[ension] also becomes too great and the television set passes into the x-ray protection switch-off mode;
 independent switching of the (decay) time constant and of the damping factor;
 testing should be of structural nature; the number of functional tests should be as small as possible.

Digital phase locked loop systems are already conventionally used for T[ele]V[ision] applications; for instance, a circuit arrangement of the type mentioned above is known from document EP 0 619 653 A1.

The continuous-time oscillator disclosed in document EP 0 619 653 A1 has a mechanism for frequency adaptation which is based on the switching of gate delays. On account of this mechanism, the frequency range is limited to a few percent, which is why it is necessary to provide a further control loop by means of which the system is freed from process expansions and by means of which the frequency is adapted to the desired range.

When this type of continuous-time oscillator is operated at its upper frequency limit, parasitic capacitances which can be attributed for example to connecting wires take control of the operating frequency of the open loop and also control of the actual frequency range. This causes problems in I[ntegrated]C[ircuit] production.

Thus, the frequency range may be too small and the frequency loop has to take control. During frequency correction, the phase locked loop decouples, that is to say the phase locked loop unlocks and has to be coupled or locked on again; this is visible on the screen as line interference.

The implementation of the digital phase locked loop according to document EP 0 619 653 A1 already provides a mechanism for adapting the dynamics. It is possible to adapt the parameters time constant, in particular decay time constant, natural (loop) frequency and/or damping in the coupled or locked-on state.

When the system determines a phase difference which is greater than a threshold, the fastest possible time constant is used. This increases the detection range to the overall frequency range that can be covered. The time constant is then reduced in defined steps; this causes large phase jumps and rapid modulations of the frequency.

In T[ele]V[ision] applications, this causes damage to the deflection transistor and/or switching to the x-ray protection mode, because the high voltage exceeds the x-ray limit. In audio applications, this causes interfering and/or unusual and unacceptable noise during the normal operating modes. The fastest time constant cannot be adapted. Although this can be implemented in principle, changes in the reference frequency can then be covered only indirectly.

The analog part of the PLL design according to document EP 0 619 653 A1 is very large and can be adapted to smaller processes only under extremely difficult conditions. In this connection, in the very critical PLL layout according to document EP 0 619 653 A1, there is not only the problem of converting this layout to the smaller process but also the difficulty that the power supply has to be reduced.

For this purpose, the analog PLL part requires a new structure, and it is very difficult to provide a structure which provides at least the same jitter performance as before (in data transmission, "jitter" refers to phase fluctuations and thus changes over time of signal frequencies, wherein these are fluctuations of fixed time points, for example of the time of the transition from one signal amplitude to another, of a digital signal; jitter can occur at all frequencies and on data clocks can lead to data losses if the jitter leads to timing violations; in addition, however, in the case of video clocks, jitter can also lead to image interference, for example to a line-wise pixel offset and thus to drawn-out edges; in the case of audio applications, jitter can lead to interference signals and to a poor signal-to-noise ratio).

Last but not least, the PLL layout implemented according to document EP 0 619 653 A1 is very sensitive with respect to the phenomenon of so-called "ground bounce" (=chip-internal raising of the ground level, which also makes testing of highly integrated boards more difficult).

In the I[ntegrated]C[ircuit]s of type SAA4978 and SAA4979 (=third generation integrated circuits) from Philips, only the basic architecture of the digital P[hase]L[ocked]L[oop] according to document EP 0 619 653 A1 was used, although, for the reasons mentioned above, there were certain system-inherent problems with the states of the continuous-time oscillator shown in FIGS. 14, 16 and 18 of document EP 0 619 653 A1 and thus with the system performance; the latter system performance turned out to be unacceptable.

In summary, in respect of the digital phase locked loop according to document EP 0 619 653 A1 it can therefore be stated that it is extremely complex in terms of its design and can only be tested with great difficulty during production. A further problem can be seen in the relatively large analog part of this known PLL system, which can only be miniaturized with great difficulty, and in the limited analog performance.

Furthermore, it is very difficult to adapt the dynamics of the system in the event of phase jumps or in the decoupled or unlocked state. In these cases, the time constant changes to very small values and the output frequency changes very rapidly, thus causing the above-described problems at E[xtremely]H[igh]T[ension]. The switching of the time constant is carried out in order to couple or lock-on the system within a very short time interval. However, independent switching of the decay time constant and damping in small steps is possible.

The digital output processor of the model type PNX3001 from Philips, which is based on the principle of the A[nalog/]D[igital]O[ne]C[hip], also already contains a digital phase locked loop which uses a digital-to-time converter and also a time-to-digital converter; however, neither independent control of the decay time constant nor independent control of the damping is possible in this case.

This known digital PLL system has a frequency detector which accelerates the coupling or lock-on operation but also reacts to phase jumps. When the system is switched off, a smooth, time-continuous transition from the operating frequency to the nominal frequency is not possible. Moreover, it is the so-called "flyback" value of the discrete ramp or time oscillator (so-called D[igital]T[ime]O[scillator] or D[iscrete]T[ime]O[scillator]) that is controlled, and not the increment, and this requires that more attention be paid to controlling the dynamic response and generating the clock phase.

Conventionally, the audio core or "sound core" of the A[nalog/]D[igital]O[ne]C[hip] has a "W[ord]S[elect]" phase locked loop which is relatively complicated and has a large number of deficiencies compared to an ideal implementation.

One main problem of the conventional implementation is that this still has an analog phase locked loop in the first control loop, which reduces the output frequency very quickly to low values when no input signal is present; this causes interfering noise at the loudspeakers, which noise may even lead, at too high an intensity, to the loudspeaker and/or power output transformer being damaged.

Moreover, the analog phase locked loop couples indirectly to the "W[ord]S[elect]" signal because it couples to the bit clock which has a certain ratio to the "W[ord]S[elect]" signal. This ratio has been measured and the splitters have been adapted such that the output has a frequency which has the desired ratio to the input frequency.

Switching of the splitter ratios also causes a relatively sudden change in the operating frequency. This causes interfering noise at the loudspeakers; it may also lead to damage to the loudspeakers.

Document U.S. Pat. No. 6,320,574 B1 describes a conventional P[hase]L[ocked]L[oop] system comprising a "L[ook]U[p]" table and a digital/analog converter branch for generating the analog phase. The resolution of the phase detector depends on the reference clock.

The frequency detector disclosed in document U.S. Pat. No. 6,320,574 B1 has a constant gain factor, "steepness", and is designed to suppress only small differences in frequency. The steepness is constant because updating of the filter takes place at intervals which are based on the reference clock.

When the system known from document U.S. Pat. No. 6,320, 574 B1 is switched to a slow time constant, the frequency increment/decrement should be small since otherwise no coupling or locking-on of the system takes place.

The increment must be significantly smaller than the detection range, and the update time must be less than the maximum detection time, namely under poor conditions. This limits the response time for the system or the frequency range which the system can cover.

Large frequencies and phase offsets cannot be handled using the frequency detector described in document U.S. Pat. No. 6,320,574 B1. Furthermore, this known frequency detector is also not designed to be robust enough with respect to large phase shifts at the input.

The loop filter of the phase locked loop according to document U.S. Pat. No. 6,320,574 B1 is quite complicated and not very flexible. Because in the subject matter of document U.S. Pat. No. 6,320,574 B1 the increment of the discrete ramp oscillator, (so-called D[igital]T[ime]O[scillator] or D[iscrete]T[ime]O[scillator]) is directly affected by the frequency detector, the updating of the frequency detector can be partially erased by the intrinsic proportional part of the loop filter. The "gain" of the intrinsic proportional path reduces the steepness of the frequency detector, so that independent adjustment is not possible.

The dynamic parameter of the loop filter of the phase locked loop according to document U.S. Pat. No. 6,320,574 B1 directly depends on the damping, so that there is less freedom and fewer possibilities in designing this known loop filter and thus this known phase locked loop.

A method of processing in particular analog input signals by means of a phase locked loop is known from document US 2003/0052997 A1.

However, document US 2003/0052997 A1 in this respect discloses an approach to the problem of coupling or locking-on in a phase locked loop, said approach being substantially different from document EP 0 619 653 A1 since use is made of window functions and various different phase detectors. Document US 2003/0052997 A1 also makes a distinction between fine lock-on and rough lock-on. Furthermore, document EP 0 619 653 A1 also describes methods for reacting to phase noise.

In the subject matter of document US 2003/0052997 A1, the performance is determined by a microprocessor, without which the system would not start. If all clocks, that is to say including the microcontroller clock, are derived from this phase locked loop, this causes start-up problems. Moreover, a large part of the resources of the microcontroller for controlling the phase locked loop are bound since during the times in which the microcontroller is occupied with the PLL no other tasks can be carried out.

A further method of processing in particular analog input signals by means of a phase locked loop is also known from document US 2002/0191727 A1.

This known procedure uses a T[ime-to-]D[igital]C[onverter]. It is prior art, and thus not novel, to improve the resolution of the phase detector. In the disclosure of document US 2002/0191727 A1, it is emphasized that the rising edge and the falling edge of the reference signal are used to determine the phase difference. This is necessary in order to obtain at the output a signal with an operating cycle of fifty percent.

In the subject matter of document US 2002/0191727 A1, neither a frequency detector nor control of the (decay) time constant or of the damping factor is provided. This is not necessary since this known system does not need to react to phase or frequency jumps at the input; rather, this known system is designed as a frequency synthesizer.

In this way, this known system does not require long time constants which would indicate the use of a frequency detector. Furthermore, this known system also has no D[igital-to-]T[irbe]C[onverter] to directly generate the analog phase from a digital word without an analog oscillator in the loop.

Based on the abovementioned disadvantages and deficiencies and in consideration of the outlined prior art, it is an object of the present invention to further develop a circuit arrangement of the type mentioned above and also a method of the type mentioned above such that the abovementioned disadvantages and deficiencies are avoided.

Specifically, it should be possible for the circuit arrangement and the method of operating the same to be readily adapted to various requirements. The phase locked loop that is to be proposed should be simple in terms of its design and easy to test during, production. Finally, the analog part of the circuit should be reduced as far as possible in order to be able to adapt the entire circuit arrangement to various manufacturing processes in as simple a manner as possible.

This object is achieved by a circuit arrangement having the features specified in claim 1 and by a method having the features specified in claim 7. Advantageous refinements and expedient developments of the present invention are characterized in the respective dependent claims.

The present invention is thus based on the principle of a digital P[hase]L[ocked]L[oop] system (=integrated circuit arrangement) which is designed for an adaptable dynamic response and which can replace both the known PLL system according to document EP 0 619 653 A1 and also the known "W[ord]S[elect]" PLL system for the A[nalog/]D[igital] O[ne]C[hip] project.

The phase locked loop according to the present invention is an approach which can be used in many fields of application, for instance audio, T[ele]V[ision] and/or video.

The circuit arrangement according to the present invention, which operates in accordance with the method according to the present invention, essentially has two main components, namely a frequency locked loop and an essentially digital phase locked loop.

The phase locked loop couples to the analog input signal in the form of the horizontal synchronization signal or line synchronization signal (=so-called "hsync" signal in the case of a T[ele]V[ision] application; generally: "hin" signal in the case of other applications, such as on an audio basis or video basis).

In this connection, account should be taken of the fact that T[ele]V[ision] signal processing and video signal processing are essentially the same; it is merely pointed out that instead of "hsync" also "hin" is used as input signal, therefore in this respect it should be noted in principle that the relationship of the signal is not defined; rather, the characterization of the signal is important, which has a low frequency compared to the clock signal and serves as reference signal for the P[hase]L[ocked]L[oop].

The phase is measured at the rising edge of the analog input signal or at the falling edge thereof. By means of a T[ime-to-]D[igital]C[onverter] a resolution or accuracy in the subpixel or subclock range is achieved. The phase is fed to a loop filter which generates an increment for a digital ramp or time oscillator (=so-called D[igital]T[ime]O[scillator]).

The overflow value of the digital ramp oscillator and the time increment are split by one another by means of a (signal) splitter in order to determine the phase of the output clock signal. This output clock signal is converted by a D[igital-to-]T[ime]C[onverter] from the digital domain to the analog real-time domain.

Taking account of the fact that the P[hase]L[ocked]L[oop] system according to the present invention is based on a virtually full digital approximation, in order to improve the phase resolution of the circuit arrangement use is made of the TDC/DTC combination which contains the only, relatively small analog part of the P[hase]L[ocked]L[oop] system.

Accordingly, the present phase locked loop system—unlike the documents from the prior art which were discussed above—can readily be scaled to different design processes and be tested without any difficulty during the production of integrated circuits (ICs).

If the output frequency is lower than the highest possible output frequency of the digital-to-time converter and if the necessary output phase jitter is in the order of magnitude of $2 \cdot t_{DTC}$ ($t_{DTC}$=delay of an individual subphase or of an individual "tap" of the delay line of the digital-to-time converter), the output phase can be used directly.

In the present application, the necessary output frequency is higher, so that according to one development according to the invention of the present circuit arrangement and also of the present method a further phase locked loop is used to multiply the frequency.

Unlike the first, essentially digital phase locked loop, this further or second phase locked loop is analog and is set as a second loop which follows the first, essentially digital phase locked loop. At the output, a (frequency) splitter makes available all the necessary signals which have a defined phase relationship with respect to one another.

On account of the configuration of this analog P[hase]L[ocked]L[oop], it follows the digital P[hase]L[ocked]L[oop] without affecting the dynamic response of the overall system. If, furthermore, a phase relationship to the input signal of the analog PLL is required, the output splitters of the analog PLL must be reset at least once with this input signal.

According to one advantageous development, in the loop filter of the digital P[hase]L[ocked]L[oop] according to the present invention, in the normal PLL mode the output signal of the phase detector is multiplied by a proportional coefficient (=proportional factor) by means of a proportional element. In the integral path of the loop filter, the output signal of the proportional element is once again multiplied by the proportional coefficient (=proportional factor) in a further proportional element and by an integral coefficient (=integral factor) in an integral element and then integrated in an integrator unit.

Preferably, this integrator comprises a limiter for limiting the integrator value. The output signal of the integrator and the output signal of the proportional path are added and limited in order to limit the frequency range of the digital ramp oscillator. The output signal of the loop filter is the increment value for the digital ramp oscillator.

According to one particularly inventive development of the present circuit arrangement and of the present method, operation of the digital P[hase]L[ocked]L[oop] can be switched on and off, that is to say the control loop of the digital PLL is closed or opened.

When switching off operation of the digital PLL by opening the control loop, the digital or discrete ramp oscillator pulls in to an adjustable frequency in a linear manner without any frequency or phase jump and with an adjustable time constant. The transition from one frequency to the next frequency is likewise possible in a linear manner without any frequency or phase jump and with an adjustable time constant.

In the present circuit arrangement and also in the present method, the time constant may be very long. In order to reduce the amount of time required for the coupling or lock-ing-on and to increase the coupling/lock-on range, according to one particularly inventive development at least one frequency detector is provided, the steepness of which can also be adjusted within a wide range.

Although a frequency detector within a digital loop is disclosed in document U.S. Pat. No. 6,320,574 B1, this known type of frequency detector can only be used for small frequency deviations and has a dynamic characteristic which is different from the frequency detector according to the present invention and depends on the coupling or lock-on direction. This frequency detector known from document U.S. Pat. No. 6,320,574 B1 is also not reliable with respect to large phase jumps.

Unlike the subject matter according to the disclosure of document U.S. Pat. No. 6,320,574 B1, the refinement explained in the present invention is not subject to any restrictions since there is no limitation of the frequency range to be detected by the frequency detector. The dynamic response of the circuit arrangement according to the present invention during the coupling or lock-on phase does not change with the coupling or lock-on direction.

The fact that the time taken to update the frequency detector is longer the smaller the difference between reference frequency and feedback:frequency is a further advantageous criterion of the present invention compared to the prior art. The frequency detector can in theory detect any small frequency differences and is automatically inactive as soon as the P[hase]L[ocked]L[oop] has locked and thus there is a more or less constant phase relationship between the input signal of the P[hase]L[ocked]L[oop] and the output signal of the P[hase]L[ocked]L[oop]. The frequency detector implemented in the present circuit arrangement is completely robust with respect to phase shifts.

The (decay) time constant, the damping factor and the steepness of the frequency detector in the present invention can be controlled separately and independently of one another as parameters of the system, and this is significantly different from the frequency detector disclosed in document U.S. Pat. No. 6,320,574 B1, in which these parameters are dependent on one another.

With regard to the advantages brought about by the present invention, it should furthermore be noted that the circuit arrangement and the method of operating the same allow control of the time constant and of the damping independently of one another.

In this connection, a vanishing damping constant (=a vanishing damping factor) would mean that the system is not damped; a sinusoidal oscillation with the natural (loop) frequency would then be seen. The greater the damping constant (=damping factor), the more the control process is damped and the smaller the overshoot.

Given a damping factor of between zero and one, there is still an overshoot. If, by contrast, the damping constant is exactly one or more than one, there is no longer an overshoot in second-order systems; this case is also referred to as the aperiodic (limit) case (cf. Jan Lunze, "Regelungstechnik 1 [Control engineering 1]", Springer-Verlag, 1996), in which there is typically still an overshoot but the system then no longer oscillates but rather runs exactly to its end value.

The output frequency may change only with an adjustable incline, namely even if the loop is switched to the nominal output frequency or if the nominal frequency is changed. If the input signal is taken away, the digital phase locked loop retains the last input frequency, and this can also be referred to as "freezing" of the last input frequency.

Unlike the disclosure according to document US 2003/0052997 A1, by means of the implementation according to the present invention it is possible to change the control register by means of the controller; the other components involved are autarkic.

Compared to the prior art, in particular compared to the disclosure of document US 2002/0191727 A1, the present invention is furthermore characterized in that the direct generation of an analog phase from a digital word is possible by means of the D[igital-to-]T[ime]C[onverter] without providing an analog oscillator in the loop, and specifically up to the reference clock frequency if a parallel operating logic is used to determine the phase; A further advantage of this approach is to be seen in that less phase noise occurs.

A further advantage of the present circuit arrangement compared to an analog low-frequency P[hase]L[ocked]L[oop] is described below:

Since these digital low-frequency P[hase]L[ocked]L[oop]s may be very slow and control the circuit continuously over the entire reference period, the brief control jerks which are caused by a so-called charge pump P[hase]L[ocked]L[oop] during the control process, that is to say during the time interval between the reference edges of the input signal and of the feedback signal, are omitted; these control jerks are manifest in the output signal as frequency peaks of up to more than twice the frequency in the steady state.

Such a response leads to serious interference during signal processing as a result of timing violations. There is even the possibility that a processor running to this clock will stop its processing (colloquial: "hang up") and can be woken up only by completely switching it off and switching it back on again; this is reliably avoided in the present invention.

The present invention finally relates to the use of at least one circuit arrangement of the type mentioned above and/or of a method of the type mentioned above in communication systems, in particular in audio, T[ele]V[ision] and video systems, such as in sound processors, in stereo decodes, in synthesizer tuners and/or in video processors.

The P[hase]L[ocked]L[oop] circuit arrangement according to the present invention and also the method according to the present invention can be used not only to generate signals but rather, in a manner essential to the invention, also to analyze signals, for example in measurement technology:

If the bandwidth is set to be very low, the phase modulation of the input signal can be measured behind the phase detector. This may be used for example to demodulate the phase modulation or to measure the interference phase modulation in the input signal. Since the bandwidth of the P[hase]L[ocked]L[oop] according to the present invention can be set to be very low, the phase modulation may be measured down to very low modulation frequencies.

Using the same P[hase]L[ocked]L[oop] according to the present invention, when the bandwidth is set to be large the frequency modulation can be analyzed up to relatively high modulation frequencies, that is to say a demodulation of the phase modulation or an interference frequency analysis (measurement of the interference phase modulation in the input signal) are also possible when the bandwidth is set to be large.

If the narrowband filtering and analysis of low-frequency signals was very complicated, expensive and inflexible using conventional methods from the prior art, this can be carried out very cost-effectively and yet very precisely by means of the circuit according to the present invention and by means of the method according to the present invention.

Conversely, the P[hase]L[ocked]L[oop] circuit arrangement according to the present invention and the method according to the present invention can also be used to modulate a low-frequency signal both for the frequency modulation (low bandwidth of the PLL)
and for the phase modulation (high bandwidth of the PLL).

Applications of low-frequency modulation and demodulation are, inter alia, in the field of telemetry; there, a number of channels are accommodated in one narrow low-frequency frequency range. The modulation can take place for example in F[requency]S[hift]K[eying].

The modulation takes place at a low bandwidth of the PLL in respect of the D[igital]T[ime]O[scillator] increment. The demodulation takes place at a higher bandwidth likewise in respect of the D[igital]T[ime]O[scillator] increment, in order in this way to recover the data and information.

The bandwidth of the PLL upon reception should be selected to be only so large that the adjacent channels still remain completely separate. For example, a wealth of measurement results which are not changing very quickly can be transmitted on a narrowband channel, such as meteorological data (air pressure, air humidity, temperature, wind direction, etc.), filling levels in containers, forces, voltages, vital functions and/or the like.

Likewise, the circuit arrangement according to the present invention and the method according to the present invention can also be used:
  to transmit low-frequency signals of additional services in existing services (for example text in the sync[hronization] signal of a television set) and/or
  to control a television set from the transmitter (for example remotely changing image format, volume and/or the like); these services do not require large bandwidths.

In the audio field, too, additional data and information can be transmitted by means of the present invention, for example performer, title, advertisements or control of device parameters such as volume or frequency response of the audio channel.

One advantage of these applications is that the channel bandwidth can remain constant and that an additional transmission can take place in the frequency gaps. The transmission protocol remains unchanged. The same P[hase]L[ocked]L[oop] according to the present invention can be configured for various applications. In order to switch from phase modulation to frequency modulation or from phase demodulation to frequency demodulation, all that is required is to switch the bandwidth and change the feed point or reduction point
  in front of the loop filter (phase modulation) or
  behind the loop filter (frequency modulation).

Likewise, the extraction of G[lobal]P[ositioning]S[ystem] signals from the G[lobal]P[ositioning]S[ystem] data stream offers applications for a P[hase]L[ocked]L[oop] circuit according to the present invention and also for a method according to the present invention. Since the satellites move, the reference frequency always changes a little as a result of the Doppler effect, so that the frequency position and/or the phase position does not always coincide with the receiver. Furthermore, the signal is jittered with so-called random noise and the frequency differs from satellite to satellite.

The P[hase]L[ocked]L[oop]s which are used in such a case according to the invention are not seldom software-based; the PLL according to the present invention is also suitable for this purpose.

In this case, only the phase detector, the loop filter and the D[igital]T[ime]O[scillator] are required; the T[ime-to-]D[igital]C[onverter]/D[igital-to-]T[ime]C[onverter] modules are omitted. Likewise, the second analog P[hase]L[ocked]L[oop] is not required since it is merely a case of reconstructing low-frequency signals in the millisecond range.

If necessary, the frequency locked loop can also be realized exclusively in the form of software. The P[hase]L[ocked]L[oop] can thus be operated as pure software, omitting the second P[hase]L[ocked]L[oop] and the T[ime-to-]D[igital]C[onverter]/D[igital-to-]T[ime]C[onverter] modules. On account of the characteristic of the phase transfer response and of the frequency transfer response, regardless of the type of implementation it can be ascertained whether a P[hase]L[ocked]L[oop] according to the present invention is incorporated.

The P[hase]L[ocked]L[oop] circuit according to the present invention is therefore also of interest in respect of the G[lobal]P[ositioning]S[ystem] since conventionally there are still problems in terms of locking onto the data signal. One possible improvement in this respect is given by suitably adapting the bandwidth and the center frequency of the P[hase]L[ocked]L[oop] circuit according to the present invention, wherein the bandwidth and the center frequency can be adjusted independently of one another in a very simple manner.

One further application of the circuit arrangement according to the present invention and of the method according to the present invention may be in voice distortion or in voice scrambling. In this case, the P[hase]L[ocked]L[oop] can be used for example to modulate voice to a changing carrier frequency.

For this purpose, the carrier frequency as input signal and the D[igital]T[ime]O[scillator]_inc[rement] have to be switched together so that the P[hase]L[ocked]L[oop] does not unlock; the modulation takes place on the D[igital]T[ime]O[scillator]_inc[rement].

Further applications of the present invention can be found in medical technology, when the P[hase]L[ocked]L[oop] according to the present invention is used for example at the heart frequency and/or at slight deviations to activate and control a pacemaker.

A further field of use within the context of measurement technology can be seen in speed measurements or in distance measurements using ultrasound:

In the case of speed measurements, the Doppler effect which occurs is used to carry out relative speed measurements. By means of the P[hase]L[ocked]L[oop] according to the present invention, it is possible to drastically increase the resolution with ultrasound, wherein for example the change in the increment may be the measurement parameter.

In the case of distance measurements, this is the phase position between the transmitted signal and the received signal. In this case, the D[igital]T[ime]O[scillator] word (reference "dto_fl[y]b[ack]") may be the measure of the distance when the P[hase]L[ocked]L[oop] has locked onto the transmitted signal and the status of the D[igital]T[ime]O[scillator] word is measured when the echo is received.

The P[hase]L[ocked]L[oop] system according to the present invention and also the operating method based thereon according to the present invention can be used wherever, in a digital environment, locking onto a low-frequency signal is required or a very narrowband filtering of an input signal is desired.

Adaptations can then usually only be carried out at the center frequency (reference "inc_nom") of the P[hase]L[ocked]L[oop]. The incorporated dynamic parameters already cover a wide usable range of the P[hase]L[ocked]L[oop]; the filter of the present system and possibly also the D[igital]T[ime]O[scillator] have to be adapted only if even lower input frequencies and/or even slower reactions to the input signal with time constants in the range of more than about one second are required.

As already mentioned above, there are various possibilities for advantageously refining and developing the teaching of the present invention. In this respect, on the one hand reference is made to the claims subordinate to claim 1 and claim 10 and on the other hand a more detailed description is given below of further refinements, features and advantages of the present invention, inter alia with reference to the implementation shown by way of example in FIGS. 1 to 10 in four examples of embodiments.

In the drawings:

FIG. 1 schematically shows a first example of embodiment of a circuit arrangement according to the present invention which operates in accordance with the method according to the present invention;

FIG. 2 schematically shows an example of embodiment of a loop filter which is implemented in the circuit arrangement of FIG. 1, FIG. 7, FIG. 8 and FIG. 9;

Figure 7:
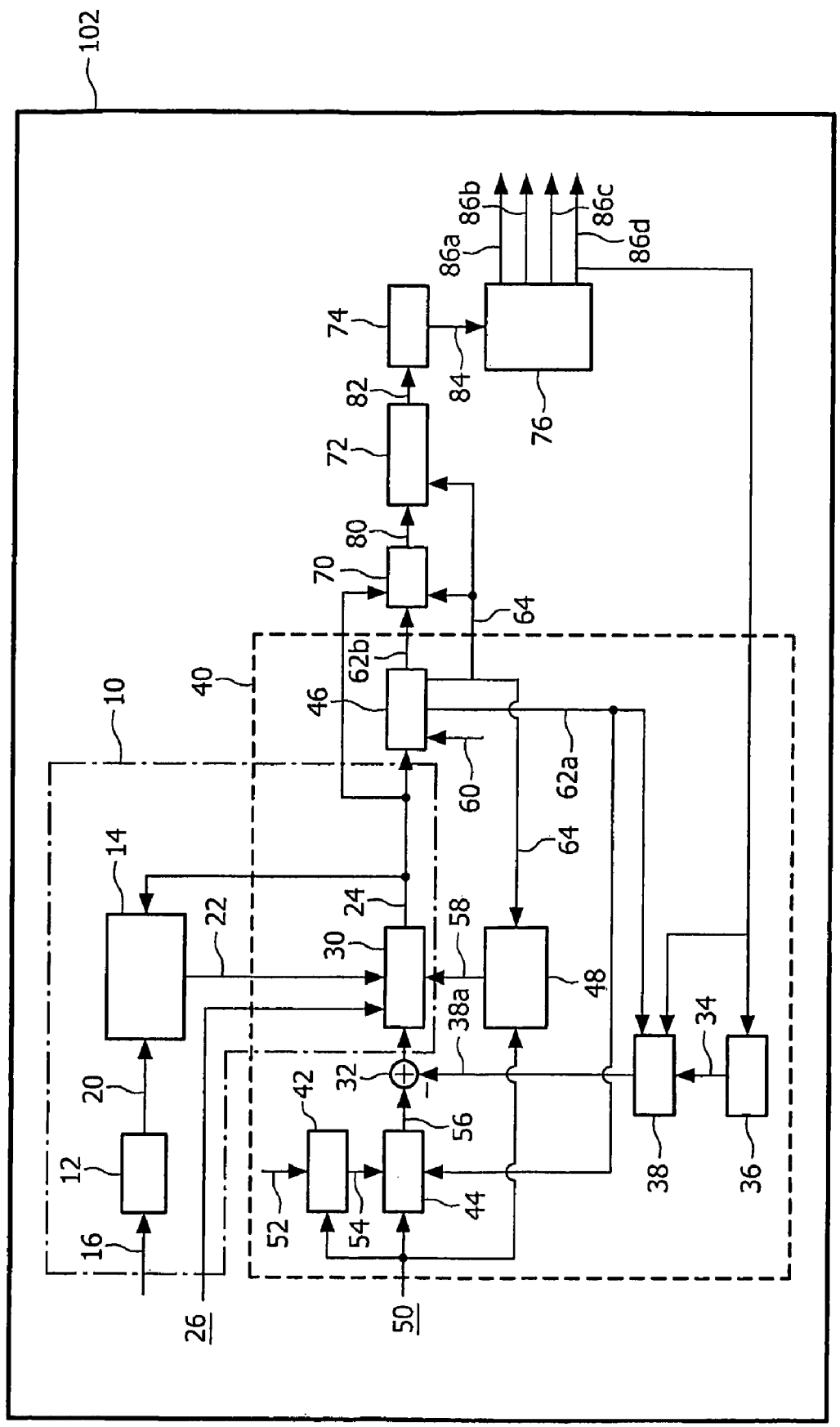
Figure 8:
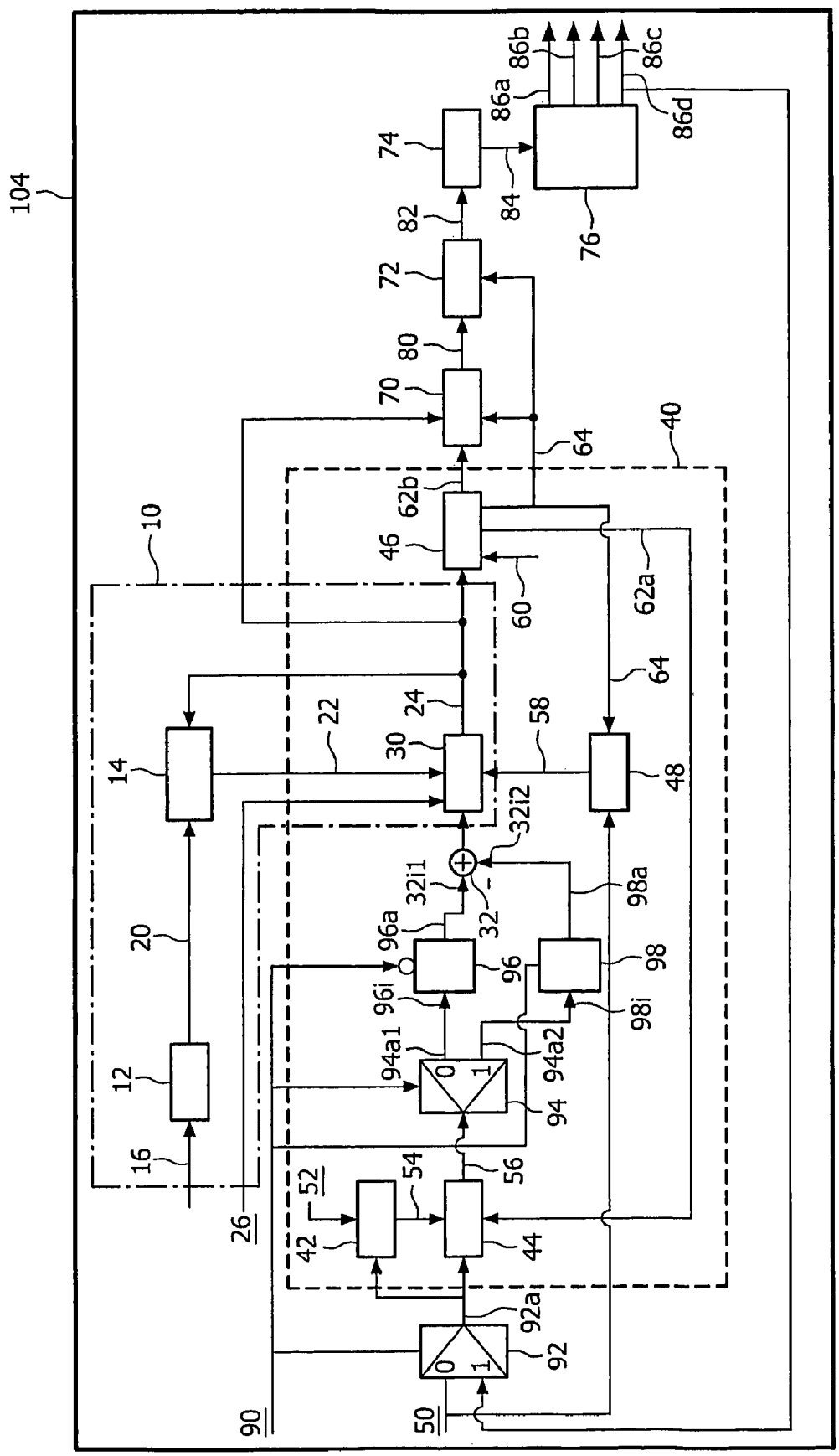
Figure 9:
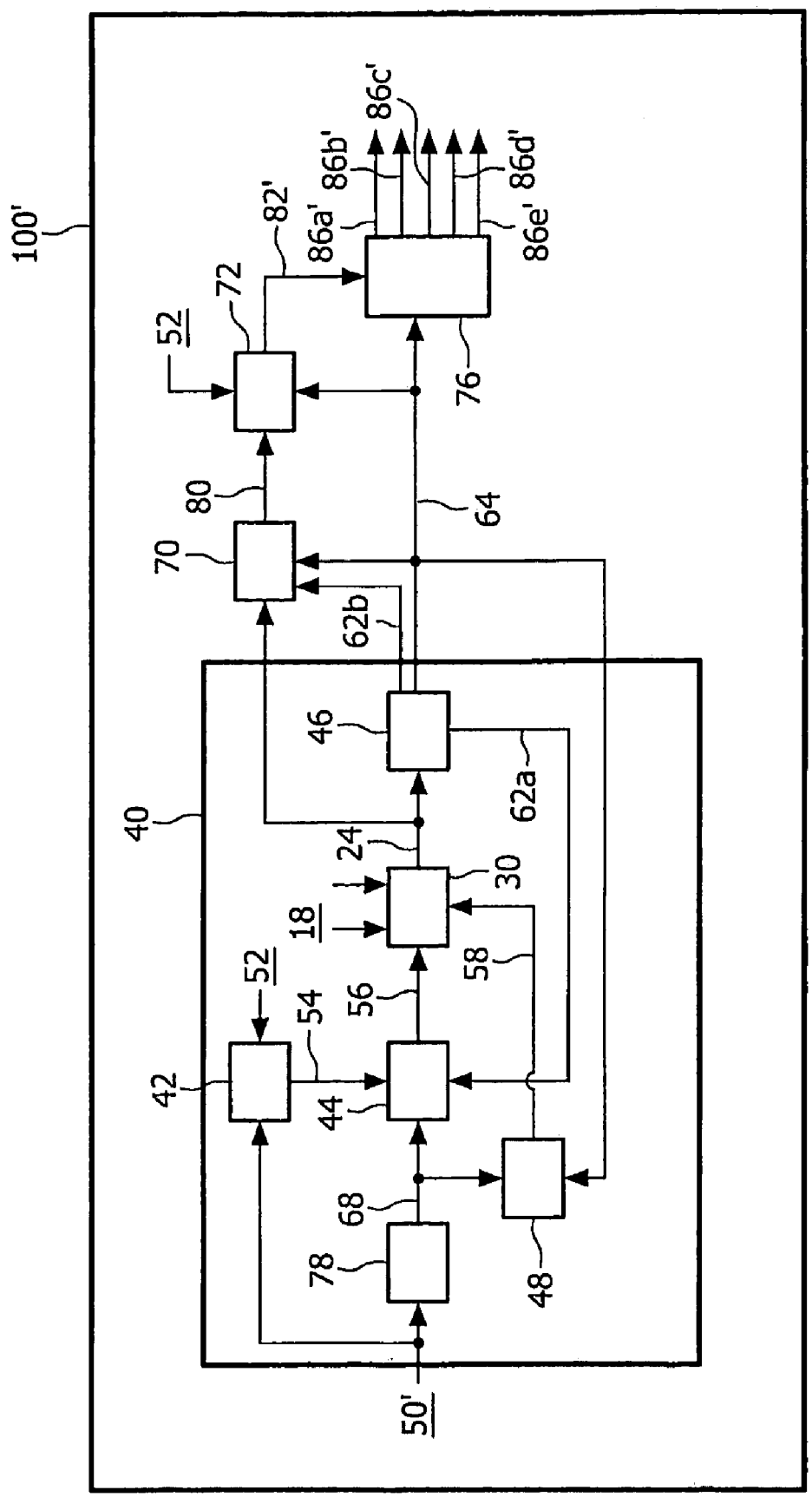
Figure 10:
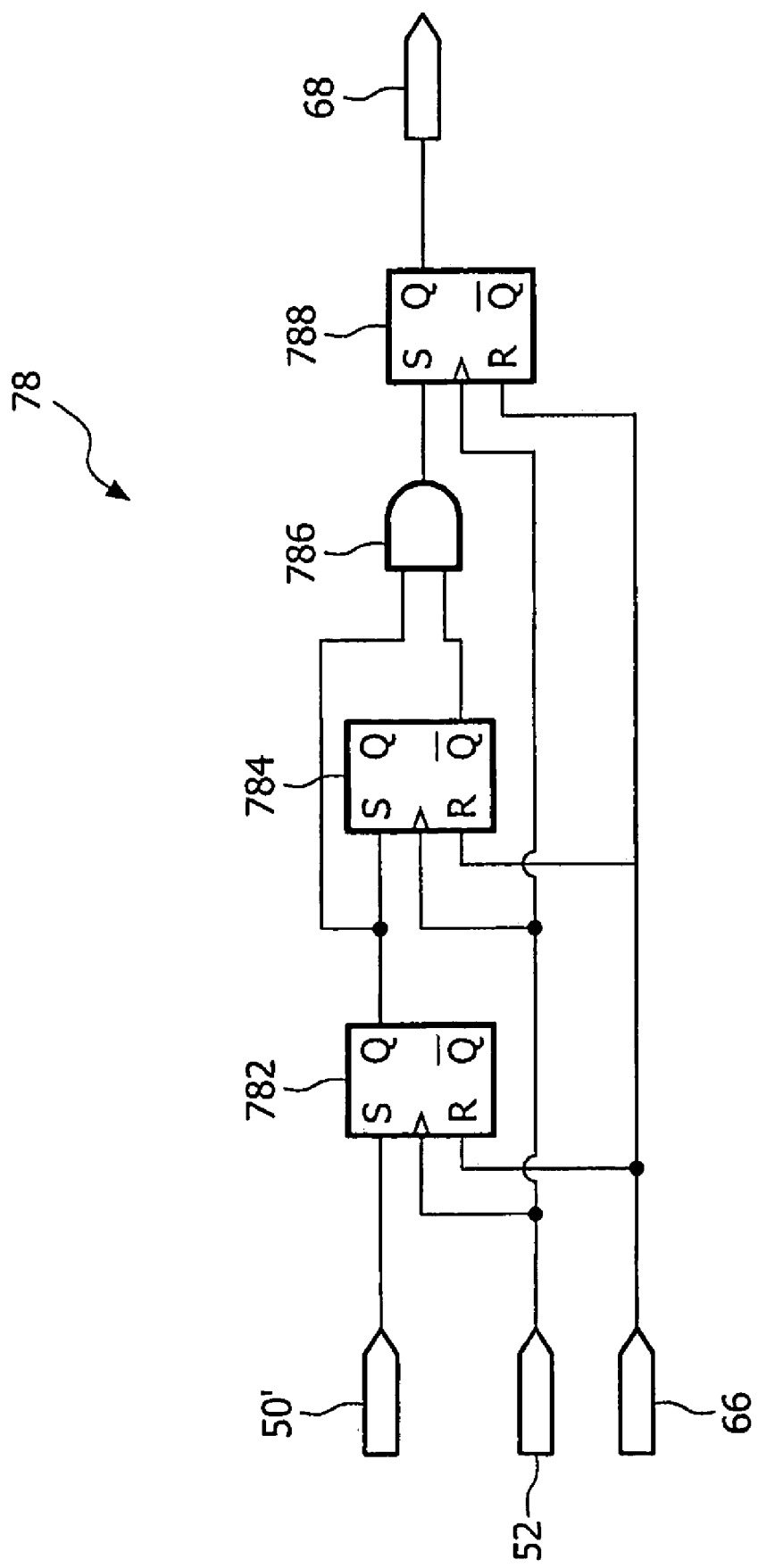

FIG. 7 schematically shows a second example of embodiment of a circuit arrangement according to the present invention which operates in accordance with the method according to the present invention;

FIG. 8 schematically shows a third example of embodiment of a circuit arrangement according to the present invention which operates in accordance with the method according to the present invention;

FIG. 9 schematically shows a fourth example of embodiment of a circuit arrangement according to the present invention which operates in accordance with the method according to the present invention; and FIG. 10 schematically shows an example of embodiment of an edge detector which is implemented in the circuit arrangement of FIG. 9.

Identical or similar developments, elements or features are provided with identical references in FIGS. 1 to 10.

Figure 1:
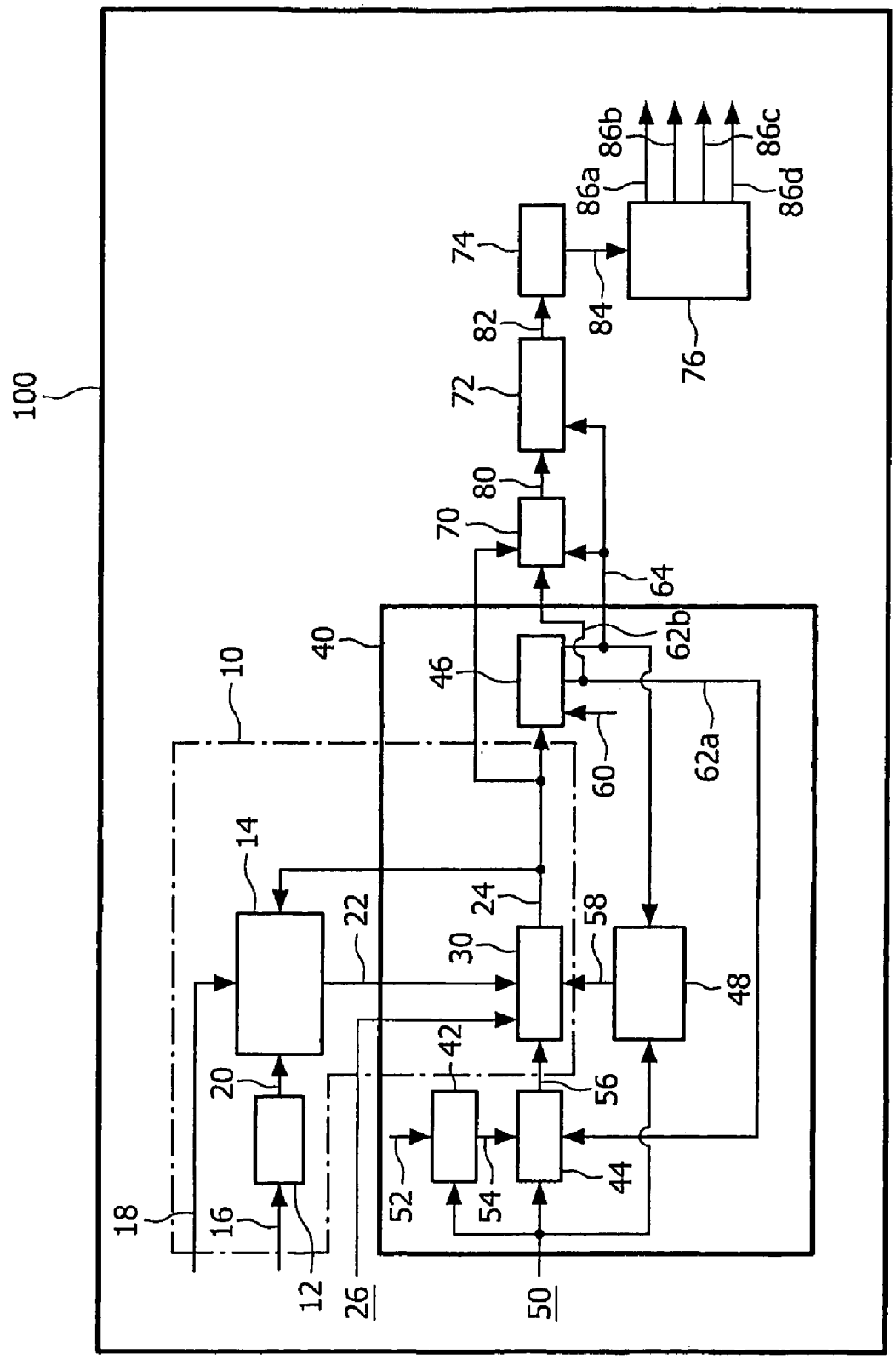

In order to avoid unnecessary repetition, the following explanations relate, in terms of the developments, features and advantages of the present invention (unless stated otherwise), both to the circuit arrangement 100 shown in FIG. 1 and to the circuit arrangement 102 shown in FIG. 7 and to the circuit arrangement 104 shown in FIG. 8 and to the circuit arrangement 106 shown in FIG. 9.

In the first example of embodiment of the present invention shown in FIGS. 1 to 6, there is shown a circuit arrangement 100 which operates in accordance with the method according to the present invention. The circuit arrangement 100 is intended for use in general applications such as, for example, in audio, T[ele]V[ision] and/or video processing, with defined requirements for the jitter performance (in data transmission, "jitter" refers to phase fluctuations and thus changes over time of signal frequencies, wherein these are fluctuations of fixed time points, for example of the time of the transition from one signal amplitude to another, of a digital signal; jitter can occur at all frequencies and on data clocks can lead to data losses if the jitter leads to timing violations; in addition, however, in the case of video clocks, jitter can also lead to image interference, for example to a line-wise pixel offset and thus to drawn-out edges; in the case of audio applications, jitter can lead to interference signals and to a poor signal-to-noise ratio).

As can be seen from FIG. 1, an essentially digital phase locked loop 40 (=digital PLL) is a main component of the circuit arrangement 100. In this connection, in respect of the classification "essentially digital" in relation to the PLL system, it is to be considered that in principle different grades of "digital" phase locked loops exist:

For instance, in the past, phase locked loops which contained a digital phase detector and in: which the remaining components were analog was referred to as digital; in other documents, phase locked loops which have only a digital phase detector and a digital loop filter were referred to as digital.

In the present invention, however, a digital phase locked loop 40 is defined in that phase information is detected by means of a digital phase detector 44, an increment signal 24 is determined by means of a digital loop filter 30 which is fed with the output signal 56 output by the phase detector 44, and a discrete ramp or time oscillator 46 is fed with the increment 24 output by the loop filter 30 and also a clock signal 60 (=so-called "clkpll" system clock: square wave signal with for example fifty percent pulse duty factor; the present invention also works in the case of other percentage pulse duty factors) in the order of magnitude, for example, of about $10^2$ Megahertz, for example a clock signal of 54 Megahertz.

Since the digital phase locked loop 40 is operated with a system clock 52 in the order of magnitude, for example, of about $10^2$ Megahertz, for example with a system clock of 54 Megahertz, the resulting jitter has to be reduced by integration of an external system 42, 72. This is a system 42, 72 which will be described in more detail below and which can shift a signal in one subphase of 64 (or more) subphases of the system clock 52 and can measure the subphase of a signal with respect to the system clock 52.

The only analog part of the circuit arrangement 100 is a delay line which is used both in a time-to-digital converter (TDC) 42 (as a measuring instrument for phases) and in a digital-to-time converter (DTC) 72 (as a generator for phases); according to the invention, instead of a large analog circuit, only this analog delay line of the DTC-TDC has to be adapted to the new production process; the rest is digital.

In this case, the digital-to-time converter 72 (cf. FIG. 1), which may be designed as a digital-to-analog converter (so-called DAC) for phases and which shifts the rising and/or falling edge with respect to the system clock 52 (the reference edge of the P[hase]L[ocked]L[oop] may be both rising and falling in a manner essential to the invention), forms the counterpart or complementary part to the time-to-digital converter 42, which may be designed as an analog-to-digital converter (=so-called ADC) for phases.

Within this context, the PLL 40 may be understood as a fully digital phase locked loop.

If, then, an arriving analog input signal 50 (so-called "hin" signal in general; so-called "hsync" signal in the case of a T[ele]V[ision]-based application considered here by way of example) is to be processed by means of the digital phase locked loop 40, this preferably horizontal input signal 50 (=h[orizontal]sync[hronization] signal 50 in the case of a television application) is used firstly as a reference signal to which the digital phase locked loop 40 couples or onto which the digital phase locked loop 40 locks.

In connection with the above-described possibility of using "hin" instead of "hsync" as an input signal, T[ele]V[ision] signal processing and video signal processing are to be considered in any case essentially the same, that is to say the designation of the input signal is not fixed. What is essential is the characterization of the input signal, which has a low frequency compared to the clock signal and serves as reference signal for the P[hase]L[ocked]L[oop] 40.

For coupling or lock-on, not only is the phase information detected by means of the phase detector 44 following the arrival of a rising edge of the input signal 50 or following the arrival of a falling edge of the input signal 50, but rather this phase of the input signal 50 is also digitized by means of the time-to-digital converter 42, which is fed with the system clock 52 (so-called "clk54"—system clock: square wave signal with fifty percent pulse duty factor) in the order of magnitude of 54 Megahertz.

As a result, therefore, the phase of the digital ramp oscillator 46 in relation to the input signal 50 and the subphase of the input signal 50 in relation to the clock of the digital ramp oscillator 46 are measured, wherein the digital ramp oscillator 46 and the digital loop filter 30 may usually have different clock frequencies.

As can furthermore be seen from the diagram of FIG. 1, the phase detector 44 is fed with the output signal 54, constituted for example by additional phase information, of the time-to-digital converter 42 and also a first output signal 62a (so-called "dto_flb" signal or "dto_flyback" signal) of the discrete ramp oscillator 46, this latter output signal 62a representing the status (of the register) of the digital ramp oscillator 46 with a specific word width and being constituted as a feedback signal.

In this connection, the phase measurement operation carried out by the phase detector 44 in principle consists of two parts:

a phase measurement with pixel accuracy is derived from the phase signal "dto_fl[y]b[ack]" or D[igital]T[ime]O[scillator] word (=reference 62a) of the discrete ramp oscillator 46 (=so-called DTO) in that the DTO status is scanned at the rising reference edge of the input signal 50 and/or at the falling reference edge of the input signal 50; and a phase measurement with subclock or subpixel accuracy is generated from the DTO subpixel range at the rising reference edge of the input signal 50 and/or at the falling reference edge of the input signal 50 and from the output signal 54 of the T[ime-to-]D[igital]C[onverter] 42.

The time-to-digital converter 42 is a module which makes it possible to subdivide the phase of the system clock 52 into a certain number, for example 64 (or more), subphases, for instance by using a so-called delay line; in the present example of embodiment of FIGS. 1 to 6, a 64-phase delay line is used; in principle, the more subphases in the delay line, the higher the subpixel or subclock accuracy.

The result of this is that there is a clock which seems to be 64 times faster, wherein the task of the T[ime-to-]D[igital]C[onverter] 42 is now to measure the phase position of the signal 50 (with a rising edge and/or with a falling edge) with respect to the system clock 52.

The TDC module 42 is formed by an analog part and a digital part. The analog part of the TDC module 42 is responsible for subdividing the system clock 52 into 64 subphases, wherein this division is carried out by a delay locked loop, the principle of which is similar to the principle of a PLL circuit in that the system clock 52 is given on the delay line which has 69 identical buffers. The delay brought about by the buffers is set by current-wise actuation.

In this connection, the difference between a P[hase]L[ocked]L[oop] and a D[igital-to-]T[ime]C[onverter]/T[ime-to-]D[igital]C[onverter] combination is to be seen in that in the PLL the fed-back delay line is used as oscillator whereas in the DTC/TDC only a use as a delay line is provided, in which input and output are compared with one another.

The respective output of the first buffer and of the 65th buffer is given on a phase comparator. The delay or phase difference of these signals is used for further current-wise actuation of the buffers and thus controls the delay time. The other buffers are required for adaptation to the remaining logic.

In order to measure the phase position of the input signal 50 with respect to the system clock 52, the signal 50 is given on a so-called tally which is integrated in the TDC module 42. This tally essentially has flip-flops which are clocked by the outputs of the buffers. Each subphase forms the clock of one flip-flop.

The signal 50 that is to be measured scans the outputs of the flip-flops; this information provides details about the phase position of the input signal 50 with respect to the system clock 52. The value measured in this way is converted in the digital part of the TDC module 42 into a six-bit binary number.

As a result, the subpixel accuracy can thus be improved by increasing the frequency of the system clock 52 in that the clock is fed into the delay line which contains the subpixel information in a type of tally code. The task of the time-to-digital converter 42 is to calculate the binary subpixel phase from the tally code when the reference signal arrives (cf. Marco C. Lammers, "64-tap Delay Locked Loop in CMOS18HLV technology for the ADOC project (Design Report)", Integrated Circuits Laboratory Advanced Systems and Application Labs Philips Sound & Vision, document no. AR43/B682/ML, 1 Aug. 2000).

The benefit of the time-to-digital converter 42 for the digital phase locked loop 40 therefore lies in the use of the artificially generated "higher" system clock and in the possibility of being able to shift signals in terms of their phase.

The pixel phase and the subpixel phase are combined for example by the weighted adding of the two values and are fed to the loop filter 30 which generates the increment signal "inc" (=reference 24) for the discrete ramp oscillator (so-called D[iscrete]T[ime]O[scillator]).

In principle, the loop filter 30 may be used in the four illustrated examples of embodiments of the circuit arrangement 100 (cf. FIG. 1), of the circuit arrangement 102 (cf. FIG. 7), of the circuit arrangement 104 (cf. FIG. 8) and of the circuit arrangement 106 (cf. FIG. 9), wherein a number of filter variants may be used for the loop filter 30.

In order to fulfill the requirement of a separately adjustable control response in terms of the (decay) time constants $(2 \cdot \omega_n \cdot \xi)^{-1}$ and in terms of the damping 4, a loop filter 30 with P[roportional]I[ntegral] control is selected, wherein account is taken of the fact that a P[roportional]I[ntegral] controller represents an optimum in terms of its control mode:

A pure I[ntegral] controller changes the manipulated variable only slowly (cf. Jan Lunze, "Regelungstechnik 1", Springer-Verlag, 1996); thus, an I[ntegral] controller cannot react quickly to large control deviations and tends to oscillate.

A pure P[roportional] controller on the other hand reacts very quickly to control deviations, wherein the control loop can tend towards large oscillations (cf. Jan Lunze, "Regelungstechnik 1", Springer-Verlag, 1996) when there is a phase rotation by about 180 degrees. However, such a phase rotation takes place only when a delay, that is to say a shift in the order of magnitude of the reference frequency, occurs in the control loop.

However, this is taken into account in the design of the control loop and reliably avoided; experience has thus shown that a P[roportional] controller does not have the problem that it tends to oscillate since in the normal situation there is no phase rotation by about 180 degrees that is necessary for this purpose.

Rather, the fundamental problem of the P[roportional] controller is the residual control error which depends on the input parameter—in this case on the input frequency; in addition, without an I[ntegral] part of the system, a residual control deviation can occur in a pure P[roportional] controller if the input parameter deviates from the mean value of the P[roportional] controller.

If P[roportional] controller and I[ntegral] controller are combined, the result is a controller which on account of its P[roportional] part can react quickly to changes in the control variables and which can continuously change its manipulated variable on account of the I[ntegral] part and also on account of the P[roportional] part. P[roportional]I[ntegral] controllers may be designed such that the control deviation is very small or even disappears; however, the control deviation is not automatically zero.

Figure 2:
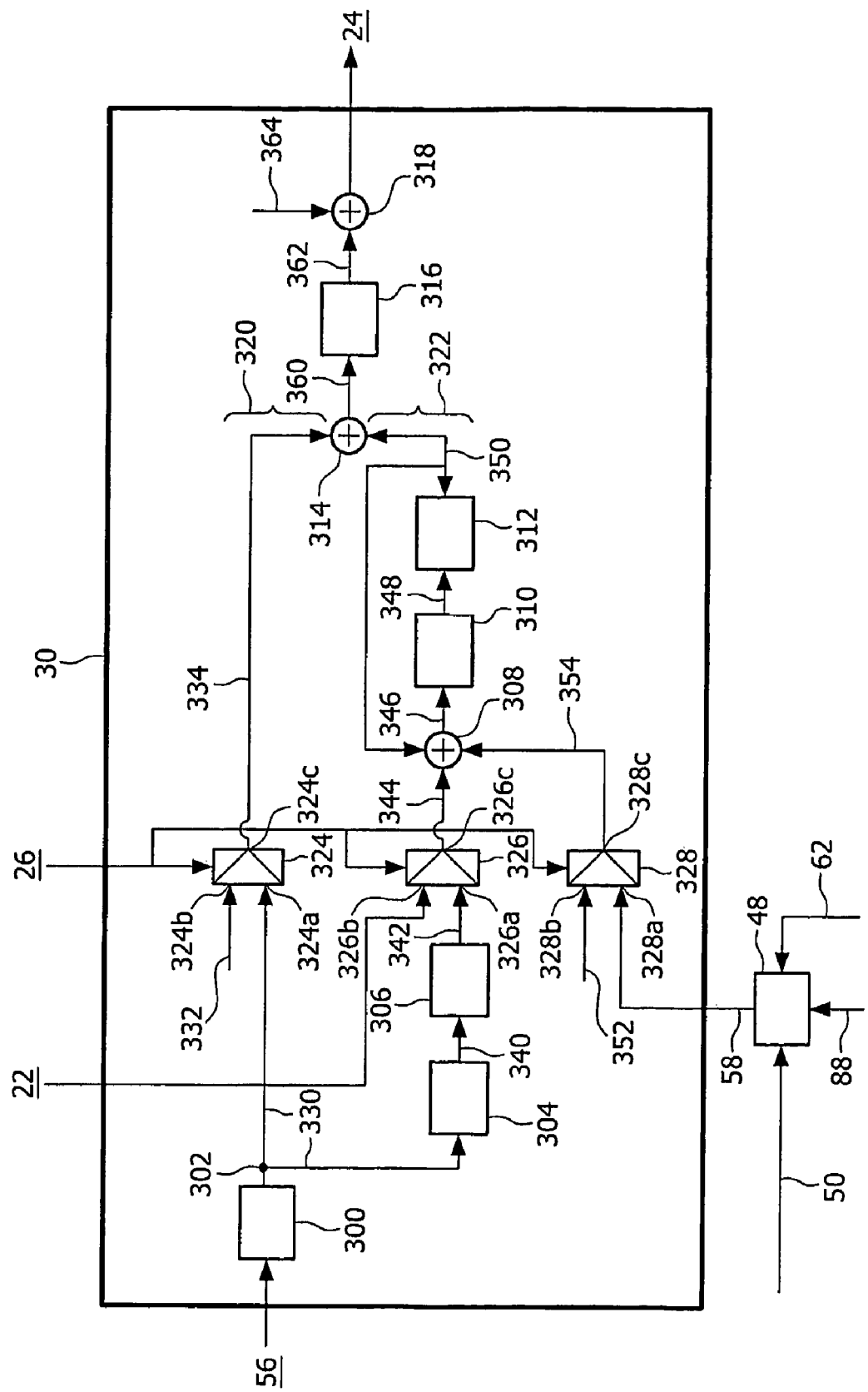

As shown in the diagram in FIG. 2, the loop filter 30 has a first proportional element 300 for multiplying the output signal 56 of the phase detector 44 by a proportional coefficient or proportional factor $K_p$. Behind the proportional element 300 the path within the loop filter 30 branches off, namely into a proportional path 320 (the upper path in FIG. 2) and into an integral path 322 (the lower path in FIG. 2).

The integral path 322 firstly has a second proportional element 304 for multiplying the output signal 330 of the first proportional element 300 by the proportional coefficient or proportional factor $K_p$ and then an integral element 306, connected downstream of the second proportional element 304, for multiplying the output signal 340 of the second proportional element 304 by an integral coefficient or integral factor $K_i$.

The arrangement of the first proportional element 300, the second proportional element 304 and the integral element 306 as shown in FIG. 2 is selected such that the loop filter 30 meets the set requirements, namely of being able to separately adjust the damping factor 4 and the decay time constant $(2 \cdot \omega_n \cdot \xi)^{-1}$:

As will be shown below using mathematical equations, the time constant $(2 \cdot \omega_n \cdot \xi)^{-1}$ depends only on the proportional coefficient or proportional factor $K_p$ and thus satisfies the set requirements. In order that the damping factor τ on the other hand is not dependent both on the integral coefficient (=integral factor $K_i$) and on the proportional coefficient (=proportional factor $K_p$), but rather only on the integral coefficient (=integral factor $K_i$), the integral path 322 of the loop filter 30 is firstly supplemented by the proportional factor $K_p^2$.

By shifting (="placing before the brackets") the steepness $K_p$ assigned to the first proportional element 300 into the input path, that is to say before the point 302 of branching into the proportional path 320 and integral path 322 (cf. FIG. 2), the loop filter 30 can be further simplified. In the digital conversion of the loop filter 30, a saving is thus made in terms of registers. The equations given below in the description, including the transfer function h(s), result for the loop filter 30 expanded in this way.

The damping factor $\xi=0.5\cdot(K_D\cdot K_O\cdot T/K_i)^{1/2}$ and the (decay) time constant $(2\cdot\omega_n\cdot\xi)^{-1}=(K_D\cdot K_O\cdot K_p)^{-1}$ then in each case depend on only one parameter, namely

- the damping factor $\xi$ on the integral coefficient (=integral factor) $K_i$ and
- the time constant $(2\cdot\omega_n\cdot\xi)^{-1}$ on the proportional coefficient (=proportional factor $K_p$).

These two variables can thus be adjusted separately via the integral coefficient (=integral factor) $K_i$ and the proportional coefficient (=proportional factor $K_p$) by means of the loop filter 30.

In order to integrate the output signal 342 of the integral element 306, an integrator is provided which is composed of the components 308, 310, 312 and specifically has

- a third adder 308 for adding the output signal 342 of the integral element 306 to the output signal 58 of a frequency detector 48 and to the fed-back output signal 350 of the integrator 308, 310, 312,
- an integral value limiter 310 (--> symbol i-clip) for limiting the output signal 346 of the third adder 308 and
- a delay element 312 (--> symbol $z^{-1}$), wherein the integrator is essentially formed by the fed-back delay element 312.

Unlike the procedure according to document U.S. Pat. No. 6,320,574 B1, in the present invention it is advantageous to have a proportional path 320 and an integral path 322 arranged separately and to update the integral part with the frequency detector 48, which takes place by feeding the output signal 58 of the frequency detector 48 to the third adder 308 implemented in the integral path 322.

Otherwise (cf. document U.S. Pat. No. 6,320,574 B1), the coupling or lock-on characteristic varies as a function of the respective direction with which the coupling or lock-on takes place, wherein this direction may be given by frequencies higher than the reference frequency or by frequencies lower than the reference frequency. The "gain" in the intrinsic proportional path 320 in this case reduces (cf. document U.S. Pat. No. 6,320,574 B1) the steepness of the frequency detector 48, so that independent adjustment is not possible.

As can furthermore be seen from the diagram of FIG. 2, the output signal 330 of the proportional path 320 and the output signal 350 of the integral path 322 are added in a first adder 314 connected downstream of these two paths 320, 322.

A frequency limiter 316 (--> symbol f-clip) for limiting the frequency of the output signal 360 of the first adder 314 is connected downstream of this first adder 314; a second adder 318 for adding the output signal 362 of the frequency limiter 316 to a nominal increment signal "inc_nom" (=reference 364) is in turn connected downstream of the frequency limiter 316.

FIG. 2 furthermore shows the feature, essential to the invention, that the output signal 360 of the first adder 314 is formed as a function of the respective operating mode "pll_mode" (=reference 26) of the phase locked loop 40 either as explained above or by feeding to the integral path 322 the output signal "i_freq" (=reference 22) of the adaptation unit 14 while at the same time feeding to the proportional path 320 at least one vanishing signal "0" (=reference 332).

The decision, defined by the operating mode "pll_mode" (=reference 26) of the phase locked loop 40, as to which of the two variants is selected is taken by means of three so-called decider units 324, 326, 328, wherein the first decider unit 324 is connected in the proportional path 320 so that the first, in FIG. 2 lower, input 324*a* of the first decider unit 324 is fed with the output signal 330 of the first proportional element 300 (=first variant) or the second, in FIG. 2 upper, input 324*b* of the first decider unit 324 is fed with the vanishing signal 332 (=second variant), wherein the second decider unit 326 is connected in the integral path 322 so that the first, in FIG. 2 lower, input 326*a* of the second decider unit 326 is fed the output signal 342 of the integral element 306 (=first variant) or the second, in FIG. 2 upper, input 326*b* of the second decider unit 326 is fed the output signal 22 of the adaptation unit 14 (=second variant), and wherein the third decider unit 328 is connected between the frequency detector 48 and the third adder 308 so that the first, in FIG. 2 lower, input 328*a* of the third decider unit 328 is fed the output signal 58 of the frequency detector 48 (=first variant) or the second, in FIG. 2 upper, input 328*b* of the third decider unit 328 is fed a vanishing signal 352 (=second variant).

Accordingly, depending on the operating mode "pll_mode" (=reference 26) of the phase locked loop 40, the output signal 334 coming from the output 324*c* of the first decider unit 324 is either the output signal 330 of the first proportional element 300 (=first variant)

or the vanishing signal 332 (=second variant), the output signal 344 coming from the output 326*c* of the second decider unit 326 is either the output signal 342 of the integral element 306 (=first variant)

or the output signal 22 of the adaptation unit 14 (=second variant), the output signal 354 coming from the output 328*c* of the third decider unit 328 is either the output signal 58 of the frequency detector 48 (=first variant)

or the vanishing signal 352 (=second variant).

Furthermore, within the digital phase locked loop 40, the frequency detector 48 is fed the input signal 50 (reference "hin" in general or reference "hsync" in the specific T[ele]V [ision] case) and also a fed-back second output signal "dto_co" (=carry-out signal or overflow pulse "dto_c[arry_] o[ut]"; reference 64) of the discrete ramp oscillator 46; the frequency detector 48 outputs its frequency information 58 to the loop filter 30 which, in a manner essential to the invention, is assigned not only to the digital phase locked loop 40 but also to a frequency locked loop 10 (cf. FIG. 1).

This frequency locked loop 10 has an increment module 12 (=increment generation unit "Δinc") which can be fed an input signal in the form of a control signal "inc_in" (=reference 16). Furthermore, an adaptation unit 14 is connected in the frequency locked loop 10 between the increment module 12 and the loop filter 30, said adaptation unit being connected 20 to the increment module 12, being fed the increment 24 output by the loop filter 30, being designed to provide an adaptive algorithm and outputting an output signal "i_freq" (=reference 22).

The frequency locked loop 10 becomes active when the phase loop is taken out of operation via "pll_mode" (reference 26) (cf. FIG. 1). The purpose of the frequency locked loop 10 is to allow a smooth and friction-free transition without a large jump from the current operating frequency to a frequency which is set via a control signal "inc_in" (=input signal 16 of the increment module 12).

In the present application, the input is stable. Accordingly, the algorithm provided by the adaptation unit 14 for adapting the increment "inc" (=reference 24) can be relatively simple. The increment is increased or reduced in each period $T_{DTO}$ of the discrete ramp oscillator 46 by a specific Δinc of the increment generation unit 12.

In the present application, the size of Δinc is determined by a "L[ook]U[p]" table and is dependent only on the value "ki_off" (=first input signal 18 of the adaptation unit 14), which merely represents a control input.

Figure 3:
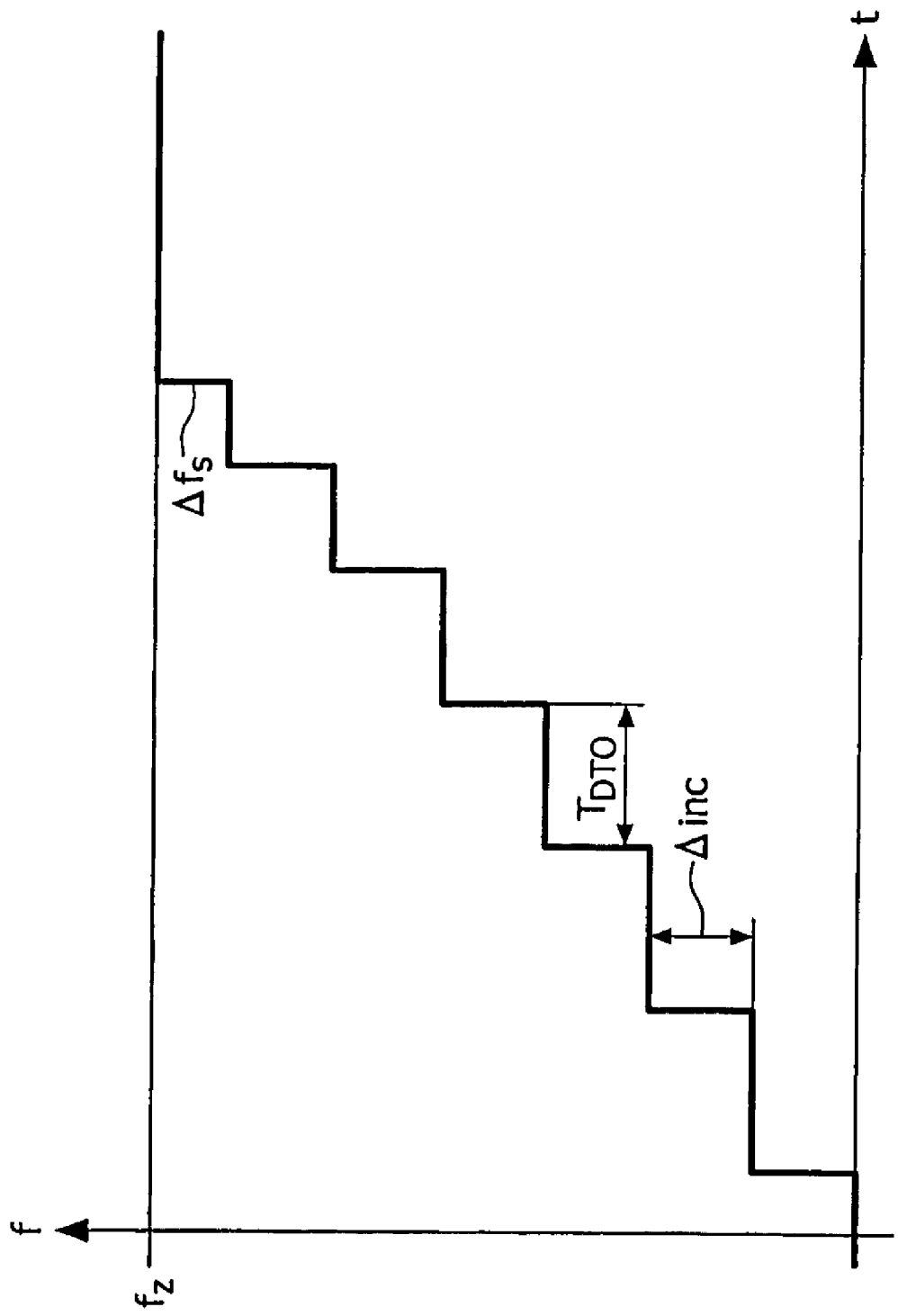
FIG. 3 shows, in a two-dimensional graph representation (=frequency f plotted as a function of the time t), the functional principle of a frequency locked loop which is implemented in the circuit arrangement of FIG. 1.

If the difference between the target frequency f, and the current frequency is less than the frequency jump brought about by Δinc, a last small (frequency) step $\Delta f_s$ takes place in order to reach the target frequency $f_z$ (cf. FIG. 3).

If the increment value changes dynamically because the target frequency $f_z$ is time-dependent, it is also possible to replace the algorithm provided by the adaptation unit 14 for adapting the increment "inc" with a control algorithm, for example with a P[roportional]I[ntegral] control algorithm.

Outside the digital phase locked loop 40, a signal splitter 70 is fed not only the time increment signal "inc" (=reference 24) provided by the loop filter 30 but also the carry-out or overflow signal "dto_c[arry_]o[ut]" (=reference 64) of the digital ramp oscillator 46 and also the status signal "dto_fl[y]b[ack]" or D[igital]T[ime]O[scillator] word (=reference 62b) of the digital ramp oscillator 46.

The digital phase of the output clock signal "dto_overflow" (=reference 80) is determined in that the second output signal 64, that is to say the carry pulse "dto_c[arry_]o[ut]" (=reference 64) of the discrete ramp oscillator 46, which is also required for the frequency detector 48, is split by means of the (signal) splitter 70 by the time increment "inc" (=reference 24) of the loop filter 30 at the time of the overflow value "dto_c[arry_]o[ut]" (=reference 64) of the discrete ramp oscillator 46.

What is more, in respect of the present invention it makes no difference whether a so-called "early value" or a so-called "late value" is calculated for the phase of the carry-out/overflow signal "dto_c[arry_]o[ut]" (=reference 64). An "early value" describes the "dto_c[arry_]o[ut]" phase in relation to the next system clock phase, a "late value" in relation to the preceding system clock cycle; in some circumstances the difference consists in an output signal output one cycle earlier or later.

As can furthermore be seen from the diagram in FIG. 1, the digital output clock signal (=clock phase 80) is fed to the digital-to-time converter 72 which is fed the overflow signal "dto_c[arry_]o[ut]" (=reference 64) of the ramp oscillator 46. The D[igital-to]T[ime]C[onverter] 72 delays the overflow signal "dto_c[arry_]o[ut]" (=reference 64) of the ramp oscillator 46 by means of the clock phase 80, in order that the output clock 82 achieves subclock or subpixel accuracy.

According to one development that is essential to the invention, the time-to-digital converter 42 and the digital-to-time converter 72 may form a common TDC/DTC module which uses the same delay line or delay path (cf. Marco C. Lammers, "64-tap Delay Locked Loop in CMOS18HLV technology for the ADOC project (Design Report)", Integrated Circuits Laboratory Advanced Systems and Application Labs Philips Sound & Vision, document no. AR43/B682/ML, 1 Aug. 2000).

The analog time-dependent output signal 82, and in particular the output clock or output frequency of the analog signal 82, can be multiplied by means of an analog phase locked loop 74 connected downstream of the digital-to-time converter 72.

At the end of the circuit 100, the output signal 84 of the analog phase locked loop 74 runs to a frequency generator/splitter "1/n" (=reference 76), by means of which four different output clock signals 86a, 86b, 86c, 86d are generated which in the bottom right of FIG. 1 can be referred to by way of example as "clk54" (=reference 86a; not identical to the system clock 52), "clk 27" (=reference 86b), "cLk13M5" (=reference 86c) and "hd" (=reference 86d).

The operation of the digital or discrete ramp oscillator 46 (=so-called "D[igital]T[ime]O[scillator]" or "D[iscrete]T[ime]O[scillator]") is illustrated below with reference to FIG. 4.

The DTO 46 is a counter which counts upwards in individual steps defined by the increment 24. Here, the value range of the ramp oscillator 46 is limited for example from the minimum value "zero" to the maximum value "dto_max". When the maximum value "dto_max" is reached, the overflow signal "dto_c[arry_]o[ut]" (=reference 64), the value of which for one period is "one", is generated by the ramp oscillator 46.

Figure 4:
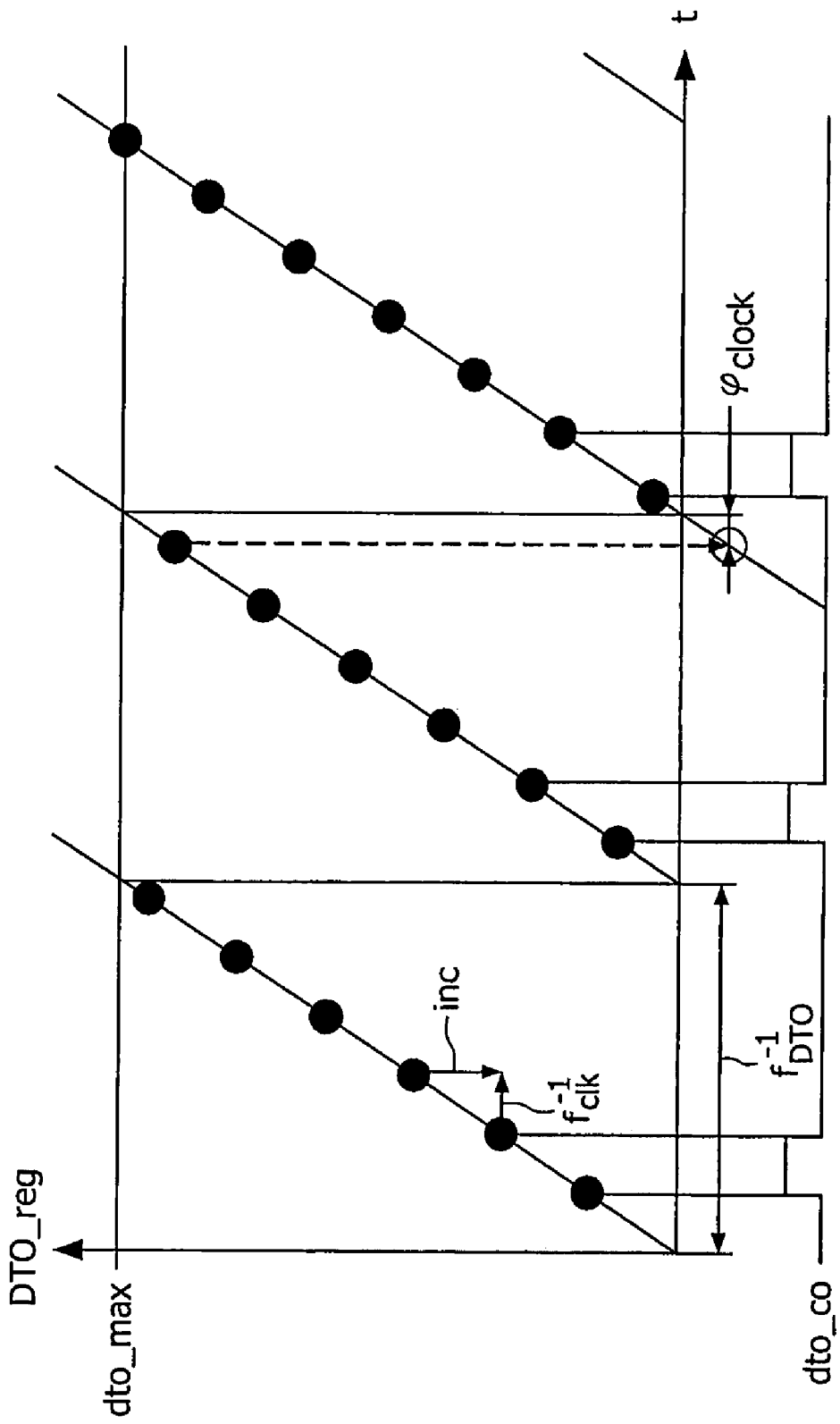
FIG. 4 shows, in a two-dimensional graph representation (=course, in particular growth, of the register "DTO_reg" plotted as a function of the time t), the functional principle of a digital ramp or time oscillator which is implemented in the circuit arrangement of FIG. 1.

As can be seen from FIG. 4, the DTO status at each clock cycle represents the phase of an ideal triangular signal at the time of the clock event. Accordingly, the frequency $f_{DTO}$ of the DTO can be calculated as $$f_{DTO} = f_{clk} \cdot \frac{inc}{dto\_max},$$

where fclk=frequency of the clock signal 52, inc=increment 24 of the loop filter 30 and dto_max maximum value of the value range of the ramp oscillator 46.

The steepness $K_O$ of the digital or discrete ramp oscillator 46 is given by the first derivation, multiplied by the factor $2\pi$, of the frequency $f_{DTO}$ of the DTO signal according to the increment 24:

$$K_O = 2\pi \cdot \frac{\partial f_{DTO}}{\partial inc}$$
$$= 2\pi \cdot \frac{f_{clk}}{dto\_max}$$

The steepness $K_D$ of the phase detector 44 corresponds to the resolution of the phase detector 44:

$$K_D = \frac{dto\_max}{2\pi}$$

With this information, the phase transfer function h(s), which is given as a function of the variable s occurring in Laplace transformation and describes the dynamic response of closed control systems for phase signals, can be calculated as $$h(s) = \frac{2\omega_n \xi s + \omega_n^2}{s^2 + 2\omega_n \xi s + \omega_n^2},$$

where the parameter time constant $(2 \cdot \omega_n \cdot \xi)^{-1} = (K_D \cdot K_O \cdot K_p)^{-1}$ results from the parameter natural (loop) frequency $\omega_n/2\pi = K_p \cdot (K_D \cdot K_O \cdot K_i/T)^{1/2}/2\pi$ and from the parameter damping factor $\xi = 0.5 \cdot (K_D \cdot K_O \cdot T/K_i)^{1/2}$.

It should be noted that the parameter T corresponds to one period of the input signal 50 and moves in an order of magnitude of for example about 25 microseconds since 1/T=forty Kilohertz corresponds approximately to the center of the bandwidth onto which the digital phase locked loop 40 is to be coupled or locked; of course, the circuit also works at frequencies which are considerably higher or lower than forty Kilohertz.

The standardized denominator of the (phase) transfer function h(s) is given by the term $s^2 + 2 \cdot \omega_n \cdot \xi \cdot s + \omega_n^2$ since in control technology it is customary to note the transfer function in standardized form (cf. Roland E. Best, "Theorie und Anwendung des Phase Locked Loop [Theory and application of the phase locked loop]", AT-Verlag, 1993).

The loop filter 30 is event-dependent on the input signal "hin" (=reference 50) or on the T[ele]V[ision] input signal "hsync". If this in particular horizontal (synchronization or line) signal 50 is missing for example as a result of the source being switched off or the video scart plug being pulled out, the output frequency is automatically held ("frozen") since no updating of the loop filter 30 then takes place.

Because the circuit arrangement 100 and in particular the phase locked loop 40 are digital, the output frequency generated in this case is stable as in the case of a crystal oscillator; this means that—unlike analog systems according to the prior art—in the present invention there are no shifts or the like, such as "leakage" for example.

The overflow value 64 of the digital ramp oscillator 46 and the increment value 24 of the loop filter 30 are combined to form the clock phase by the overflow value 64 being split by the increment value 24 in the splitter unit 70. This is shown not only with reference to FIG. 1 but also with reference to FIG. 4, in that the time interval between the last clock before the overflow takes place and the end of the virtual DTO period is characterized as φ-clock; this is also referred to as an "early value".

Instead of the early value, it is also possible to use the "late value" which is given by the time interval between the end of the virtual DTO period and the following clock cycle.

The operation of the digital frequency detector 48 will be shown below with reference to FIGS. 5 and 6.

The time constants used are of the order of magnitude of milliseconds to seconds; this means that coupling or settling of the digital phase locked loop 40 takes some time even within the "pull-in" range (cf. Roland E. Best, "Phase Locked Loop", McGraw-Hill Book Company, 1999). It may even be the case that the digital phase locked loop 40 is not coupled at all if the input frequency is outside the "pull-in" range.

The frequency detector 48 is incorporated in the circuit arrangement 100 as shown in FIG. 1 in order to extend the "pull-in" range and to accelerate the "pull-in" procedure.

In principle, with regard to the frequency detector 48, it should be considered that a change in the bandwidth within which a coupling or lock-on procedure is possible is also associated with the numerous adjustment possibilities for the decay time constant $(2 \cdot \omega_n \cdot \xi)^{-1}$ and for the damping constant $\xi$ of the digital phase locked loop 40. Depending on the setting, the frequency position and the phase position of the input signals and of the output signals with respect to one another, a coupling or lock-on operation takes place immediately, after many periods or not at all.

The use of the frequency detector 48 is intended to ensure reliable lock-on in all settings. A further important benefit of the frequency detector 48 consists in the acceleration of the coupling or lock-on operation. With regard to the mode of operation and the principle of the frequency detector 48, it seems noteworthy that the frequency detector 48 is preferably active in the background and monitors the input signal and the output signal of the digital phase locked loop 40.

Figure 5:
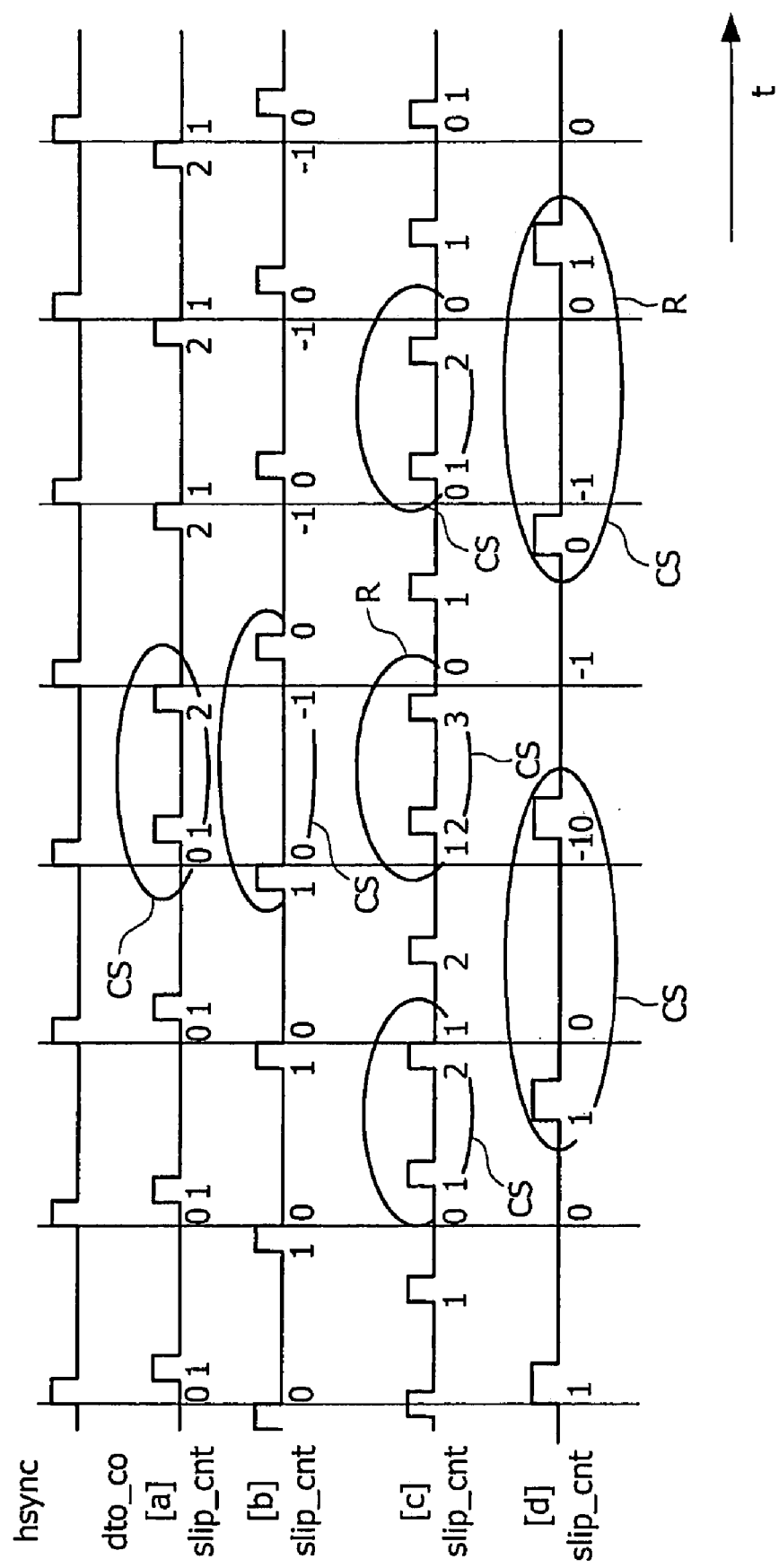
FIG. 5 shows, in a two-dimensional graph representation (=occurrence of cycle slips CS of two signals with respect to one another in the event of phase jumps and frequency offsets, plotted as a function of the time t), the functional principle of a frequency detector which is implemented in the circuit arrangement of FIG. 1.

As can be seen from FIG. 5, the frequency detector (=reference 48) counts cycle slips of two signals with respect to one another (cf. FIG. 5: "CS"; phase jumps or cycle fluctuations should have no effect), which the phase loop of the digital phase locked loop 40 would try to follow. If the steepness of the frequency detector 48 is greater than the steepness of the phase loop, the frequency detector overrules the phase loop.

Figure 6:
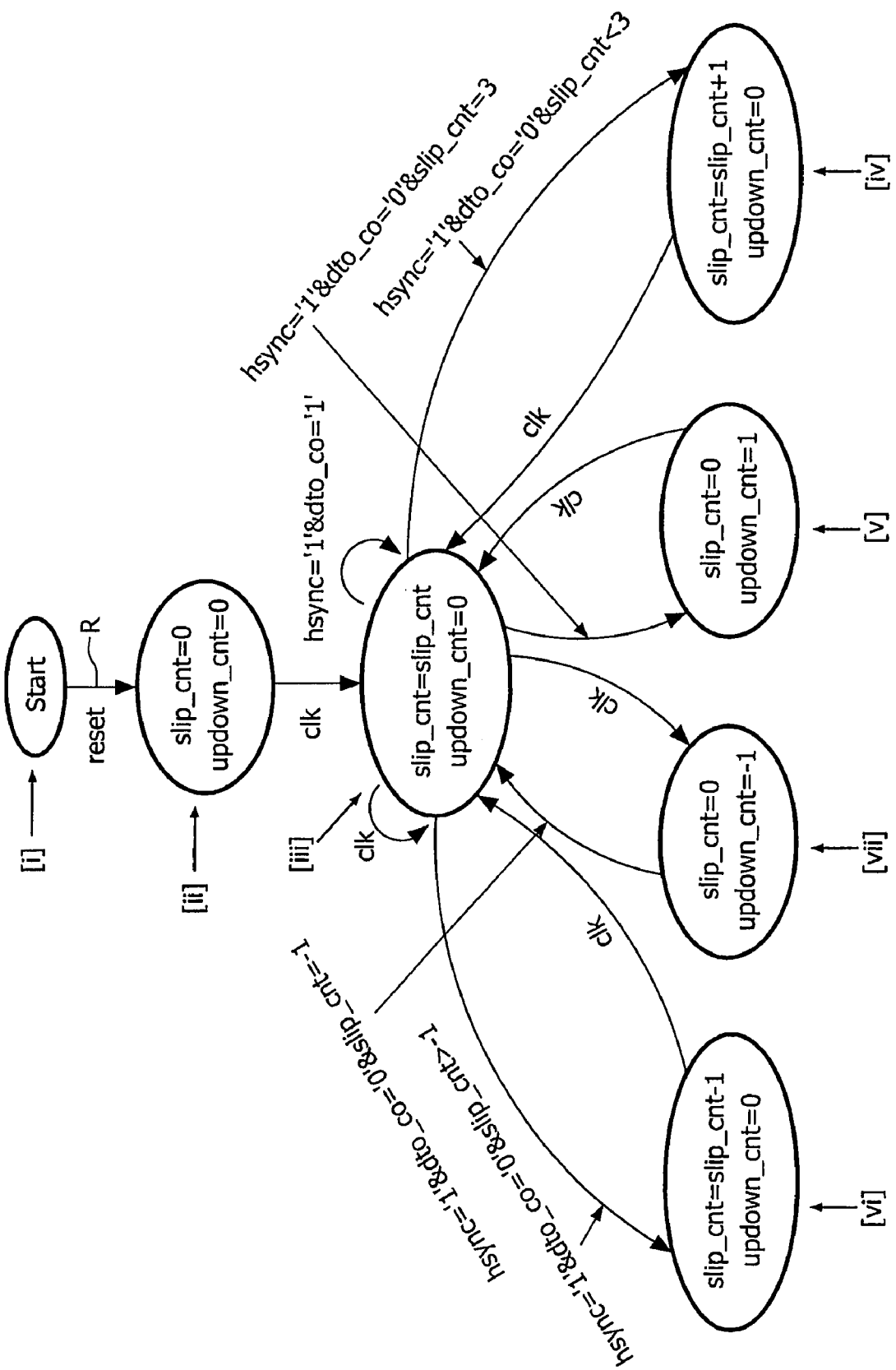
FIG. 6 shows, in the form of a F[inite]S[tate]M[achine] diagram, the operating diagram of the frequency detector of FIG. 5.

The functional principle of the frequency detector 48 is explained here with reference to FIGS. 5 and 6:

Assuming that the frequency of the input phase of the horizontal line synchronization signal "hsync" or in other applications of the general signal "hin" is stable and that the frequency of the second output signal 64 (so-called "dto_c[arry_]o[ut]" signal), constituted as feedback signal, of the discrete ramp oscillator 46 changes or that the frequency of the input phase of the horizontal line synchronization signal "hsync" or in other applications of the general signal "hin" changes and that the frequency of the second output signal 64 (so-called "dto_c[arry_]o[ut]" signal), constituted as feedback signal, of the discrete ramp oscillator 46 is stable, case [a] and case [b] in FIG. 5 show a simple phase jump in both directions.

This is a real cycle slip CS:

in case [a] two "dto_c[arry_]o[ut]" pulses occur between two "hin" edges, specifically between two "hsync" edges; this means that the "dto_c[arry_]o[ut]" signal frequency is too high at times;

in case [b] no "dto_c[arry_]o[ut]" pulse occurs between two "hin" edges, specifically between two "hsync" edges; this means that the "dto_c[arry_]o[ut]" signal frequency is too low at times.

Both in case [a] and in case [b], the frequency after the cycle slip CS is the same as before and is constant; accordingly, both in case [a] and in case [b] no further cycle slip CS occurs.

In this connection, a phase jump causes a cycle slip CS when the phase jump exceeds the phase offset between the input phase (=reference "hin" in the case of a general signal for various applications of the circuit arrangement 100 and of the associated method; specific reference "hsync" in the case of a horizontal line synchronization signal) and the feedback phase (=reference "dto_c[arry_]o[ut]"). If, therefore, there is a vanishing phase offset, a cycle slip CS may take place or be present between each phase measurement.

Case [c] in FIG. 5 and case [d] in FIG. 5 show a situation with a non-vanishing phase offset. In this case, the frequency is constant and the cycle slips CS take place at more or less constant time intervals.

For a given frequency offset, all cycle slips CS take place in the same direction. In case [c], cycle slips CS of the same type as in case [a] take place since the output frequency is too high. In case [d], cycle slips CS of the same type as in case [b] take place since the output frequency is too low.

However, in this connection it should be considered that under real conditions the situation is not as constant as in FIG. 5; nevertheless, two cycle slips CS in the same direction indicate a frequency offset between input frequency and output frequency.

This knowledge is used in the frequency detector 48. The operation of the frequency detector 48 is shown using the F[inite]S[tate]M[achine] diagram in FIG. 6:

The frequency detector 48 has a cycle slip counter (reference "slip_cnt") which counts the number "ha_pos_edge" of the positive "ha" (="hin", in particular "hsync") edges and the number of positive "dto_fl[y]b[ack]" edges. When a positive "ha" (="hin", in particular "hsync") edge is present, the counter content "slip_cnt" is reduced by the value 1; when a "dto_fl[y]b[ack]" edge is present, the counter content "slip_cnt" is increased by the value 1.

Accordingly, following a restart or reset R, the counter content "slip_cnt" lies between 0 and 1 or between 0 and −1, depending on the phase status and on the timing of the restart or reset R. If "ha_pos_edge" (="hin_pos_edge", in particular "hsync_pos_edge", that is to say the active edge of the input signal 50) and "dto_fl[y]b[ack]" agree or coincide, nothing happens; the current situation is then restored (=case [iii] in FIG. 6).

If there are one or more cycle slips (reference CS) in the positive direction, that is to say if the number of "dto_fl[y]b[ack]" signals exceeds the number of "ha_pos_edge" signals by the value 1, then the counter content "slip_cnt" of the counter is increased by the value 1, that is to say the counter content "slip_cnt" of the counter then no longer moves between 0 and 1 but rather between 1 and 2 (cf. case [a] and case [c] in FIG. 5; cf. case [iv] in FIG. 6).

With the next slip in this direction, the counter content "slip_cnt" of the counter reaches the value 3 (cf. case [c] in FIG. 5). This causes a reset R of the counter to the value "slip_cnt"=0, and the signal "updown_cnt" assumes the value 1 for a period (cf. case [v] in FIG. 6); "updown_cnt" is the signal, based on the loop filter 30, by means of which the content of the loop filter 30 is increased to a given value, namely depending on the gain factor "kif" (=reference 88 in FIG. 2) of the frequency detector 48. Following this action, the counter content "slip_cnt" of the counter again begins to move between the value 0 and the value 1.

If the frequency offset is small, two cycle slips CS in this (positive) direction are required in order to bring about an action at the loop filter 30.

If the frequency offset is so great that more than two "dto_fl[y]b[ack]" pulses occur between two "ha_pos_edge" pulses, the limit of the counter content "slip_cnt" of the counter is reached within one "ha" (="hin", in particular "hsync") cycle.

If there are one or more cycle slips (CS) in the other, i.e. negative, direction, that is to say if the number of "ha_pos_edge" signals ("ha_pos_edge"="hin_pos_edge", in particular "hsync_pos_edge", that is to say the active edge of the input signal 50) exceeds the number of "dto_fl[y]b[ack]" signals by the value 1, then the counter content "slip_cnt" of the counter is reduced by the value 1, that is to say the counter content "slip_cnt" of the counter then no longer moves between 0 and 1 but rather between −1 and 0 (cf. case [b] and case [d] in FIG. 5; cf. case [vi] in FIG. 6).

When the counter content "slip_cnt" of the counter reaches the value −1, no direct action of the frequency detector 48 takes place as long as the "dto_fl[y]b[ack]" pulse resets the counter content "slip_cnt" of the counter to the value 0. Only when the counter content "slip_cnt" of the counter reaches the value −1 at the rising edge of the "ha_pos_edge" signal does a reset R of the counter content "slip_cnt" to the value 0 occur, and the signal "updown_cnt" is set to the value −1 (cf. case [vii] in FIG. 6), in order to reduce the content of the loop filter 30 by the same amount as in the case of the positive direction.

As mentioned above, the matter of whether the counter content "slip_cnt" of the counter moves between the value 0 and the value 1 or between the value −1 and the value 0 depends on the time selected for the reset R and/or the "ha" (="hin", in particular "hsync") phase and the "dto_fl[y]b[ack]" phase;

for this reason, it is possible for an additional action of the frequency detector 48 to take place when starting (cf. case [i] in FIG. 6).

However, this does not have an adverse effect on performance since the frequency detector 48 has moved into the steady state following the first reset R of the counter content "slip_cnt" of the counter (cf. case [ii] in FIG. 6) (<--> frequency detector 48 in the "settled state") and operation takes place in accordance with cases [iii]; [iv], [v], [vi] and/or [vii] mentioned above.

A further measure essential to the invention for improving the robustness of the frequency detector 48 with respect to phase jumps consists in the optional implementation of an internal phase offset in the order of magnitude of 180 degrees. Such an internal phase offset by X may be provided for example by adding or subtracting half the phase detector range from the phase detector result. In this case, the phase jump must exceed the phase offset in order to activate the frequency detector 48.

A measure essential to the invention as an alternative or in addition to this consists in extending the counter limit for activating the frequency detector 48 to higher values in order that more than two cycle slips CS are required for a correction procedure.

In all the cases mentioned above, the frequency detector 48 is automatically taken out of operation when the digital phase locked loop 40 is coupled or locked on, in order that there is a more or less constant phase relationship between input signal and output signal. Since no further cycle slips occur, also no further actions of the frequency detector 48 take place.

A further parameter essential to the invention for the frequency detector 48 is the effect of the "kif" factor 88 (cf. FIG. 2). If the steepness of the frequency detector 48 is too great and if the digital P[hase]L[ocked]L[oop] 40 is too slow, the phase locked loop 40 can no longer couple or lock on because another action of the frequency detector 48 takes place before the phase locked loop 40 can settle at the new frequency.

In this way, it may happen that the PLL frequency fluctuates around the desired frequency. A solution essential to the invention for this phenomenon consists in reducing the steepness of the frequency detector 48 so that no fluctuation (=toggling) takes place. This also means that a maximum permissible steepness of the frequency detector 48 exists for each (decay) time constant of the digital phase locked loop 40 and/or for each damping constant of the digital phase locked loop 40.

In order to obtain an equal increment "inc" (=reference 24) or decrement of the loop filter 30, the steepness is reduced—compared to the system known from document EP 0 619 653 A1—by a factor of 2; however, this is unimportant as long as the increment "inc" (=reference 24) or decrement is doubled; specifically, this is the increment of the increment, that is to say a change in the output signal of the loop filter 30 in small-steps.

In summary, it can be stated that the processing of and in particular the locking onto digital audio, T[ele]V[ision] and/or video signals is made possible by means of the present circuit arrangement 100 and also by means of the method based on this circuit arrangement 100.

For this purpose, primarily proposed is a digital P[hase] L[ocked]L[oop] system which generates various clock signals 86a, 86b, 86c, 86d from the reference signal 50 (cf. FIG. 1). The generated signals 86a, 86b, 86c, 86d are in certain relation to the reference signal 50.

In order to convert the digital phase information into an analog clock signal and vice versa, use is made of a D[igital-to-]T[ime]C[onverter]/T[ime-to-]D[igital]C[onverter] module 72/42, as a result of which a 64-times higher resolution of the output signals 86a, 86b, 86c, 86d is achieved. The system 100 also provides the possibility of generating the signals 86a, 86b, 86c, 86d independently from the system clock 52.

In order to produce the circuit arrangement 100, firstly for example a linear model may be developed for the system, this then being converted into a digital system. As has been shown, the digital PLL system 40 fulfills the requirements in all respects. The digital PLL system 40 has a simple and clear structure which can easily be modified, and can therefore be rapidly adapted to the requirements of other systems.

Furthermore, precise adjustment of the control response is possible by means of the parameter $K_p$ (=proportional coefficient or proportional factor of the first proportional element 300 and of the second proportional element 304) and by means of the parameter $K_i$ (=integral coefficient or integral factor of the integral element 306).

In this respect, a person skilled in the art of electric or electronic circuit arrangements, for example a designer of electronic circuits, will know or in particular guess that the control response of the digital P[hase]L[ocked]L[oop] 40 can be adjusted separately in terms of the (decay) time constant $(2 \cdot \omega_n \cdot \xi)^{-1}$ and in terms of the damping $\xi$.

For example, the adjustment range of the time constant $(2 \cdot \omega_n \cdot \xi)^{-1}$ lies between about eight microseconds and about one second; the damping factor $\xi$ can be adjusted by way of example in a range from about 0.25 to about 4.

The circuit arrangement 100 supplies stable bit clock signals 86a, 86b, 86c, 86d even during independent operation or when the input signal 50 fails. By holding or "freezing" the frequency when the input signal 50 fails, it is possible to avoid interference noise (so-called "Plopp effect") at the output of a sound D[igital]S[ignal]P[rocessor].

This is important when digital audio, T[ele]V[ision] and video signals are transmitted with the generated signals 86a, 86b, 86c, 86d, wherein the signals must continue to be present in a stable manner in order to avoid any interference noise occurring in the loudspeakers in the event of a sudden failure of the input signal 50 (such interference noise is produced by sudden or rapid frequency changes and may result in damage to the loudspeaker; the frequency must therefore be "frozen").

In any case, on account of its extremely small size of for example 0.4 square millimeters, the circuit arrangement 100 forms a useful alternative to conventional analog systems as are known from the prior art. The advantages of the present circuit arrangement 100 lie in the many use possibilities and in the excellent adaptability; the circuit arrangement 100 can easily be expanded or made smaller at any time.

Moreover, it is possible with this digital system 100 to implement properties and functions which with an analog system could only be implemented only with difficulty and at high cost, if at all. This includes for example the implementation of long decay time constants or the acceleration of the coupling or lock-on operation.

The first example of embodiment of a circuit arrangement 100 shown in FIGS. 1 to 6 is described by way of example above in relation to a T[ele]V[ision] application, wherein the illustrated T[ele]V[ision] application taken as a basis represents the most extensive P[hase]L[ocked]L[oop] system of this type.

FIG. 7 shows a second example of embodiment of the present invention in the form of a circuit arrangement 102 which operates in accordance with the method according to the present invention.

Unlike the first example of embodiment shown in FIG. 1, the circuit arrangement 102 shown in FIG. 7 is characterized in that the hd output signal 86d of the output splitter or frequency generator 76 has a defined phase position with respect to the input signal 50.

This is advantageous since, in the circuit arrangement 102 (cf. FIG. 7), unlike the circuit arrangement 100 (cf. FIG. 1) and the circuit arrangement 106 (cf. FIG. 9), the data, in particular the input signal 50, are not read from a memory together with the output signal 86d of the frequency generator 76 as a start signal.

In the circuit arrangement 100 (c FIG. 1) and the circuit arrangement 106 (cf. FIG. 9), the offset in the phase between the hd signal 86d and the DTO phase of the discrete ramp oscillator 46 varies after each start-up of the system but is constant following adjustment of the P[hase]L[ocked]L[oop] since the phase locked loop 40 and the ramp oscillator 46 are coupled rigidly in terms of their phase.

The possibility thus arises of shifting in the system the phase of the output signal 86d of the frequency generator 76, by introducing a phase offset (corresponding to the random but more or less constant offset between the splitter output and the DTO phase), such that the phase offset between the input signal 50 (reference "hsync_in") and the output signal 86d (reference "hd") vanishes, that is to say is zero or at least is constant in all cases, in particular following each start-up of the system.

The phase offset between the output of the frequency generator 76 and the phase of the ramp oscillator 46 is nevertheless only more or less constant because the PLL and hence also the splitter output have inherent jitter. However, this inherent jitter is for the most part filtered out in the loop filter 30.

In the second example of embodiment of the circuit arrangement 102 as shown in FIG. 7, this is achieved by a second phase detector 38 in collaboration with a second time-to-digital converter 36. These modules 36, 38 measure the phase of the hd signal 86d and subtract this value from the "hsync_in" phase of the input signal 50, which is measured by the phase detector 44 and the first time-to-digital converter 42.

The phase offset introduced is controlled by the control loop 40 to the value zero behind a fourth adder 32, but only if the output values of the two phase detectors 38 and 44 are equal. If an accuracy of one system clock period should be sufficient as maximum phase offset between the input signal 50 and the output signal 86d, the second time-to-digital converter 36 may—unlike in the diagram of FIG. 7—be omitted in a manner essential to the invention.

In order to achieve the situation whereby the output signal 86d of the frequency generator 76 has a defined phase position with respect to the input signal 50, the second phase detector 38 assigned to the digital phase locked loop 40 is fed the first output signal 62*a* of the ramp oscillator 46 and also the output signal 86*d* of the frequency generator 76. By means of the second phase detector 38, therefore, phase information of the output signal 86*d* of the frequency generator 76 is determined and output as output signal 38*a*.

Furthermore, the digital phase locked loop 40 has the fourth adder 32, connected between the first phase detector 44 and the loop filter 30, for adding the output signal 56 of the first phase detector 44 to the in particular negative output signal 38*a* of the second phase detector 38.

The second time-to-digital converter 36, which is fed the output signal 86*d* of the frequency generator 76 and the output signal 34 of which is fed to the second phase detector 38, is likewise assigned to the phase locked loop 40 of the circuit arrangement 102 and is used in particular when an accuracy of one system clock period is not sufficient as the maximum phase offset between the input signal 50 and the output signal 86*d* of the frequency generator 76.

In any case, the same delay line can be used for the second time-to-digital converter 36 as for the digital-to-time converter 72 (DTC module) and the first time-to-digital converter 42. Only the digital part of the DTC module is provided a second time.

As an alternative or in addition to the second example of embodiment 102 (cf. FIG. 7), the frequency splitter 76 (so-called counter 1/n) may be (periodically) reset to a given value by means of a signal derived by the ramp or time oscillator 46 or by means of the input signal 50, in order to achieve a defined phase relationship with respect to the hsync_in input signal 50. However, this means that the number of clock signals derived from the PLL, for example the number of output signals 86*a*, 86*b*, 86*c*, 86*d* of the frequency generator 76, is not reliably constant between two positive or negative hd edges of the output signal 86*d* of the frequency generator 76 and may fluctuate within narrow limits, for example within ±1.

According to one development that is essential to the invention, the circuit arrangement 102 (cf. second example of embodiment shown in FIG. 7) can be changed to the circuit arrangement 100 (cf. first example of embodiment shown in FIG. 1) by the signal 38*a* (=output signal of the second phase detector 38) being switched to zero. Such a changeover may be useful for example upon start-up.

FIG. 8 shows a third example of embodiment of the present invention in the form of a circuit arrangement 104, wherein in this circuit arrangement 104, too, the output signal 86*d* of the frequency generator 76 has a defined phase position with respect to the input signal 50.

This circuit arrangement 104, in particular the implementation of the phase locked loop 40 described below, is used in particular when it is to be expected that the output signal 38*a* of the second phase detector 38 (cf. circuit arrangement 102 shown in FIG. 7) is essentially stable and rarely or never changes over time.

In the circuit arrangement 104 (cf. FIG. 8), the output signal 92*a* of a first switching element 92 is switched as a function of a switching signal 90 between the input signal 50 (state "0") and the output signal 86*d* made available by the frequency generator 76 (state "1"). The first switching element 92 may be connected upstream of the digital phase locked loop 40 as shown in FIG. 8 or unlike in FIG. 8 may be contained in the digital phase locked loop 40.

The phase detector 44 is then fed the output signal 92*a* of the first switching element 92, that is to say the input of the phase detector 44 is switched between the signal "hsync_in" (reference 50) and the corresponding output signal "hd" (reference 86*d*) by means of the switching signal "phasedet_sel" (reference 90).

The output of the phase detector 44 is also correspondingly switched in order to file the result either in a first register element 96 assigned (state "0") to the input signal 50 or in accordance with the switching signal 90 in a second register element 98 assigned (state "1") to the output signal 86*d*. This means that the first register element 96 or the second register element 98 is fed the output signal 56 of the phase detector 44, by a second switching element 94 branching into the corresponding state paths "0" or "1", depending on the switching signal 90.

The switching algorithm given by the switching signal 90 can be implemented in various ways:

Every second line is switched. In this way, however, the PLL 40 can follow only with considerably lesser dynamics.

If the input phase is uncertain, but the phase of the hd output signal 86*d* of the frequency generator 76 is stable with respect to the discrete ramp oscillator 46, switching may also be carried out less often, for example in the vertical scanning gaps.

Optionally, however, this may take place even less often and/or be limited only to ranges in which the input phase is stable, that is to say in which the value in the register for the hsync_in phase of the input signal 50 in the last lines has not changed or has barely changed.

In any case, care should be taken that the hd phase of the output signal 86*d* of the frequency generator 76 does not noticeably change with respect to the ramp oscillator 46 in the update period of the hd phase register; otherwise, there is the risk that the line interference will become visible or that circuits, such as for example a comb filter for chrominance-luminance separation, will no longer work in a satisfactory manner.

In order to implement the switching algorithm in practice, in the circuit arrangement 104 shown in FIG. 8 the fourth adder 32 is fed the passed-through first output signal 94*a*1 of the second switching element 94 as a function of the negated switching signal 90 and the passed-through second output signal 94*a*2 of the second switching element 94 as a function of the switching signal 90. This fourth adder 32 thus adds the output signal 96*a* of the first register element 96, which is present at its first input terminal 32*i*1, to the in particular negative output signal 98*a* of the second register element 98, which-is-present at the second input terminal 32*i*2.

According to a further alternative or supplementary development which is essential to the invention, the circuit arrangement 104 (cf. third example of embodiment shown in FIG. 8) can be changed to the circuit arrangement 100 (cf. first example of embodiment shown in FIG. 1) by the signal 98*a* (=output signal of the second register element 98) being switched to zero. Such a changeover may be useful for example upon start-up.

The ability of the circuit arrangement 104 (cf. third example of embodiment shown in FIG. 8) to be changed to the circuit arrangement 100 (cf. first example of embodiment shown in FIG. 1) can nevertheless also advantageously be achieved in a simple manner in that the switching signal 90 (reference: phasedet_sel) is held at the value which releases the path for the signal 50 (=input signal).

Compared to the circuit arrangement 102 (cf. FIG. 7), the circuit arrangement 104 (cf. FIG. 8) offers the advantage that a phase detector, namely the second phase detector 38, is saved, as a result of which it is possible to make a saving in terms of surface area and production test time.

The circuit arrangement 100 (cf. FIG. 1), the circuit arrangement 102 (cf. FIG. 7) and the circuit arrangement 106 (cf. FIG. 9) by contrast offer the advantage that these three examples of embodiments are not based on a switching algorithm. In the case of a switching algorithm, interference which is usually evened out may become visible on account of too slow switching; the circuit arrangement 104 shown in FIG. 8 is thus advantageously to be used in particular when only slight interference is to be expected from the PLL and the splitter lying there behind.

According to one development which is essential to the invention, it is moreover possible to combine the circuit arrangement 102 (cf. second example of embodiment shown in FIG. 7) with the circuit arrangement 104 (cf. third example of embodiment shown in FIG. 8) such that the circuit arrangement 102 (cf. second example of embodiment shown in FIG. 7) can be designed such that it can be changed over. Thus, both the phase offset introduced by means of the second phase detector 38 and the switching algorithm given by the switching signal 90 can be implemented in the same circuit arrangement.

A fourth example of embodiment of a circuit arrangement 106 in the form of a further application can be seen from the block diagrams in FIGS. 9 and 10. In order to avoid unnecessary repetition, with respect to the developments, features and advantages of the digital P[hase]L[ocked]L[oop] system shown in FIGS. 9 and 10, reference is explicitly made to the above explanations regarding the first example of embodiment shown in FIGS. 1 to 6, the second example of embodiment shown in FIG. 7 and the third example of embodiment shown in FIG. 8 where in the text which follows no special explanations are given in relation to the fourth example of embodiment shown in FIGS. 9 and 10:

The dynamic parameters of the first example of embodiment of the circuit arrangement 100 may be taken over unchanged to the fourth example of embodiment of the circuit arrangement 106; the structure of the fourth example of embodiment of the circuit arrangement 106 is essentially the same as in the case of the T[ele]V[ision] application of the first example of embodiment of the circuit arrangement 100, wherein in FIG. 9 the signal lines from the digital ramp or time oscillator 46 (DTO) are drawn in an estimated manner to the phase detector 44 and to the frequency detector 48; in actual fact, in the sound application shown in FIGS. 9 and 10 there is no difference from the T[ele]V[ision] application shown in FIGS. 1 to 6, in which the "dto_fl[y]b[ack]" signal 62*a*, 62*b* is connected to the phase detector 44 (<--> first part 62*a* of the "dto_fl[y]b[ack]" signal 62*a*, 62*b*) and to the splitter 70 (<--> second part 62*b* of the "dto_fl[y]b[ack]" signal 62*a*, 62*b*) (both in the first example of embodiment of the circuit arrangement 100 shown in FIGS. 1 to 6 and in the second example of embodiment of the circuit arrangement 102 shown in FIG. 7 and in the third example of embodiment of the circuit arrangement 104 shown in FIG. 8 and in the fourth example of embodiment of the circuit arrangement 106 shown in FIGS. 9 and 10 different parts come off the "dto_fl[y]b[ack]" signal 62*a*, 62*b* in a manner essential to the invention, namely the first part 62*a* to the phase detector 44 and the second part 62*b* to the splitter unit 70; which parts of the word these are in each case depends inter alia on the input signal frequency and/or on the output signal frequency) and the "dto_c[arry]o[ut]" signal 64 is connected to the frequency detector 48 and to the splitter 70 (both in the first example of embodiment of the circuit arrangement 100 shown in FIGS. 1 to 6 and in the second example of embodiment of the circuit arrangement 102 shown in FIG. 7 and in the third example of embodiment of the circuit arrangement 104 shown in FIG. 8 and in the fourth example of embodiment of the circuit arrangement 106 shown in FIGS. 9 and 10 in each case both the frequency detector 48 and the splitter unit 70 and the digital-to-time converter unit 72 are fed the "dto_c[arry]o[ut]" signal 64 coming from the digital ramp or time oscillator 46).

In the fourth example of embodiment of the circuit arrangement 106 shown in FIGS. 9 and 10, the incoming horizontal line synchron(ization) signal (reference: "hsync_in"; cf. first example of embodiment of the circuit arrangement 100 shown in FIGS. 1 to 6) is replaced by a "w[ord]s[elect]" input signal 50' which in the case of digital sound signal processing in the I[nter]I[ntegratedCircuit]S[ound] format (so-called IIS format or I²S format) distinguishes between the right stereo sound channel and the left stereo sound channel.

This external input signal "ws_in" (reference 50'), which functions as reference signal, with a frequency range between 32 Kilohertz and 48 Kilohertz, firstly passes to the input of an edge detector 78 (cf. FIG. 10; an edge detector is in principle a basic circuit of digital signal processing which may be designed in a very wide range of ways) and to the input of the external time-to-digital converter 42 (TDC module).

The edge detector 78 has two essential functions: on the one hand the asynchronous input signal 50' is synchronized to the or with the 54 Megahertz system clock 52 by means of the edge detector 78, for example in order to prevent setup violations and hold time violations and in order to generate a reference signal for other functional blocks; on the other hand the edge detector 78 detects the rising edges of the input signal 50'.

In this connection, the synchronization of the asynchronous input signal 50' to the system clock 52 takes place by means of a clocked first flip-flop 782 (cf. FIG. 10). In order to detect the rising edge of the input signal 50', the input signal synchronized by means of the first flip-flop 782 is passed to a second flip-flop 784 (cf. FIG. 10).

The actual detection takes place by means of an AND gate 786 located at the output of the second flip-flop 784. The AND gate 786 (cf. FIG. 10) switches through only if the first flip-flop 782 at the output has a HIGH level and the second flip-flop 784 at the output has a LOW level. This state can exist only for a 54 Megahertz clock since one clock later the second flip-flop 784 assumes the status of the first flip-flop 782. The circuit 78 thus supplies the desired pulse 68, as shown in detail in the following procedure:

The input signal 50' is asynchronous to the system clock 52. With the next rising edge of the system clock 52 the first flip-flop 782 assumes a HIGH level. One clock later the second flip-flop 784 also assumes the HIGH level. Previously, the AND gate 786 also supplies a HIGH level, so that a third flip-flop 788 (cf. FIG. 10) also supplies a HIGH level with this clock. Since, then, the second flip-flop 784 also supplies a HIGH level, a LOW level is again present at the output of the AND gate 786; the third flip-flop 788 thus also assumes a LOW, level again.

Following detection of a rising edge of the input signal 50' by the edge detector 78, a pulse 68 with the duration of a 54 Megahertz period is output. This pulse 68 is required by the phase detector 44, the loop filter 30 and the frequency detector 48 for further data processing.

The time-to-digital converter unit 42 is an external A[nalog]/D[igital] block which divides the system clock 52 into 64 subphases. With the rising edge of the input signal 50', the subphase is measured with respect to the system clock 52 and additionally passed to the phase detector as six-bit phase information.

Following the arrival of a rising edge of the input signal 50', the phase detector 44 calculates the phase error from the phase information of the time-to-digital converter 42 and of the digital ramp oscillator 46. The phase error is then passed to the loop filter 30 by means of the output signal 56.

The loop filter 30 additionally receives, by means of the output signal 58, an information word from the frequency detector 48. The frequency detector 48 always works in the background and continuously compares the input signal 50' with the signal of the digital ramp oscillator 46:

If the digital P[hase]L[ocked]L[oop] 40 is not locked on, the input signal 50' has a frequency which differs from the frequency of the D[igital]T[ime]O[scillator] signal. In this case, the frequency detector 48 forwards the information to the loop filter 30, which then includes this in the calculation of the increment 24. The frequency detector 48 thus allows the digital P[hase]L[ocked]L[oop] 40 to pull in faster if the system is not locked on.

Even if, therefore, the digital P[hase]L[ocked]L[oop] 40 has not locked on and locks onto an input signal 50' with a frequency that is different from the frequency of the D[igital]T[ime]O[scillator] signal, this should be effected with an adjustable frequency change. This adjustment takes place by means of the steepness "ki_f_sel" or "ki_f" of the frequency detector 48.

This steepness "ki_f" of the frequency detector 48 is generated via a look-up table from the signal "ki_f_sel" such that the steepness "ki_f" of the frequency detector 48 is, proportional to twice the signal "ki_f_sel"; ki_f_sel=0 means that ki_f=0 is set (in this case the frequency detector 48 is switched off).

The signal "ki_f" is multiplied by a constant and then always added to the content of the integrator 308, 310, 312 of the loop filter 30 or subtracted from the content of the integrator 308, 310, 312 of the loop filter 30 when a frequency correction is carried out by the frequency detector 48. This is to be understood as an implementation given by way of example in order to cover as wide a dynamic range as possible with as small a word width of "ki_f_sel" as possible.

The increment 24 calculated in the loop filter 30 is passed to the D[igital]T[ime]O[scillator] 46. The D[igital]T[ime]O[scillator] 46 is thus controlled in terms of its frequency. The counter status of the D[igital]T[ime]O[scillator] 46 on the one hand provides the phase detector 44 with phase information, and on the other hand the counter status of the D[igital]T[ime]O[scillator] 46 also provides reference signals for the frequency generator 76 and for the digital-to-time converter 72.

The digital-to-time converter 72 (=DTC) is, as it were, the counterpart to the time-to-digital converter 42 (=TDC). The digital-to-time converter 72 receives from the splitter 70, in the form of the digital output signal 80 (reference: "dto_overflow"), six-bit phase information and shifts a reference signal by one subphase of 64 subphases with respect to the system clock 52.

The signal 82' generated in this way has a resolution that is 64 times higher than a system-clock-accurate resolution. This signal 82' is used for the synchronization and for the clocking of the frequency generator 76. The frequency generator 76 generates the desired output signals 86a', 86b', 86c', 86d', 86e' from the synchronization signal 82' of the DTC 72 and from the reference signals 64 of the DTO 46.

In this case, the output frequencies 86a', 86b', 86c', 86d', 86e' of the frequency generator 76 have certain ratios with respect to the word select signal frequency, for example 0.5 (<--> first output signal of the circuit arrangement 106 shown in FIG. 9), 1 (<--> second output signal of the circuit arrangement 106 shown in FIG. 9), 32 (<--> third output signal of the circuit arrangement 106 shown in FIG. 9), 64 (<--> fourth output signal of the circuit arrangement 106 shown in FIG. 9), and 128 (<--> fifth output signal of the circuit arrangement 106 shown in FIG. 9), and have defined phase positions with respect to one another.

Since the frequencies of the output signals 86a', 86b', 86c', 86d', 86e' of the frequency generator 76 lie considerably below the system clock 52, in the fourth example of embodiment of the circuit arrangement 106 a frequency multiplication by means of an analog P[hase]L[ocked]L[oop] 74 is not necessary, unlike in the first example of embodiment of the circuit arrangement 100.

This means in other words that, unlike in the first example of embodiment of the circuit arrangement 100, in the fourth example of embodiment of the circuit arrangement 106 the output frequency splitter 76, also referred to as the frequency generator, can be connected directly to the digital-to-time converter 72 (=DTC).

A further adaptation in the fourth example of embodiment of the circuit arrangement 106 compared to the first example of embodiment of the circuit arrangement 100 can be carried out with regard to the center frequency (reference: "inc_nom") for the digital ramp or time oscillator 46 (DTO) since the center frequencies of the digital phase locked loop 40 differ in the case of video (cf. first example of embodiment shown in FIGS. 1 to 6) and in the case of sound (cf. fourth example of embodiment shown in FIGS. 9 and 10).

In practice, the circuits 100, 102, 104 and 106 can be used universally, and specifically wherever an input signal 50 or 50' with a relatively low frequency is used; in some circumstances this may be a few hundred Kilohertz, possibly even Megahertz.

In factual terms, the maximum frequency of the input signal 50 is limited by the overall number of clock delays (so-called "latency") of the filter 30, of the D[igital and/or Discrete]T[ime]O[scillator] 46 and of the D[igital-to-]T[ime]C[onverter]/T[ime-to-]D[igital]C[onverter] (so-called DTCTDC 72, 42). If the latency exceeds the input frequency, the system becomes unstable. Just beforehand, the dynamic response of the system changes considerably compared to conventional theory, which does not contain the latency.

LIST OF REFERENCES 100 circuit arrangement (first example of embodiment; cf. FIGS. 1 to 6)
102 circuit arrangement (second example of embodiment; cf. FIG. 7)
104 circuit arrangement (third example of embodiment; cf. FIG. 8)
106 circuit arrangement (fourth example of embodiment; cf. FIGS. 9 and 10)
10 frequency locked loop
12 increment module (reference: Δinc), in particular increment generation unit 14 adaptation unit
16 input signal of the increment module 12 (reference: inc_in), in particular control signal of the increment module 12
18 first input signal of the adaptation unit 14 (reference: ki_off)
20 second input signal of the adaptation unit 14
22 output signal of the adaptation unit 14 (reference: i_freq)
24 increment or increment signal (reference: inc)
26 operating mode of the digital phase locked loop 40 (reference: pll_mode)
30 loop filter
300 first proportional element
302 point of branching into proportional path 320 and into integral path 322
304 second proportional element
306 integral element
308, 310, 312 integrator, having
308 third adder
310 integral value limiter (reference: i-clip)
312 delay element
314 first adder
316 frequency limiter (reference: f-clip)
318 second adder
320 proportional path
322 integral path
324 first decider unit
324a first input of the first decider unit 324
324b second input of the first decider unit 324
324c output of the first decider unit 324
326 second decider unit
326a first input of the second decider unit 326
326b second input of the second decider unit 326
326c output of the second decider unit 326
328 third decider unit
328a first input of the third decider unit 328
328b second input of the third decider unit 328
328c output of the third decider unit 328
330 output signal of the proportional path 320, in particular output signal of the first proportional element 300
332 vanishing signal
334 output signal of the first decider unit 324
340 output signal of the second proportional element 304
342 output signal of the integral element 306
344 output signal of the second decider unit 326
346 output signal of the third adder 308
350 output signal, in particular fed-back output signal, of the integral-path 322, in particular of the integrator 308, 310, 312
352 vanishing signal
354 output signal of the third decider unit 328
360 output signal of the first adder 314
362 output signal of the frequency limiter 316
364 nominal increment signal
32 fourth adder
32i1 first input of the fourth adder 32
32i2 second input of the fourth adder 32
34 output signal of the second time-to-digital converter 36
36 second time-to-digital converter
38 second phase detector
38a output signal of the second phase detector 38
40 digital phase locked loop=digital PLL
42 time-to-digital converter=TDC, in particular first time-to-digital converter=first TDC
44 phase detector, in particular first phase detector
46 digital ramp or time oscillator and/or discrete ramp or time oscillator=D[igital]T[ime]O[scillator] and/or D[iscrete]T[ime]O[scillator]
48 frequency detector
50 input signal (reference: hin or ha), in particular analog input signal, specifically horizontal synchronization signal or line synchron(ization) signal (reference: hsync)
50' input signal (reference: ws_in or w[ord]s[elect]_in), in particular for distinguishing between the left stereo sound channel and the right stereo sound channel in digital sound signal processing in the I[nstitute]I[ntegrated]C[ircuit] format
52 system clock, in particular of 54 Megahertz (reference: clk54, wherein there is no identity with the reference clk54 of the first output signal 86a)
54 output signal of the time-to-digital converter 42, in particular additional phase information of the time-to-digital converter 42
56 output signal of the phase detector 44
58 output signal of the frequency detector 48, in particular frequency information of the frequency detector 48
60 clock signal (reference: clkpll)
62a first part, directed towards the phase detector, of the first output signal of the ramp oscillator 46 (reference: dto_flb or dto_flyback), in particular status (signal) (of the register) of the ramp oscillator 46 with defined word width
62b second part, directed towards the splitter unit 70, of the first output signal of the ramp oscillator 46 (reference: dto_flb or dto_flyback), in particular status (signal) (of the register) of the ramp oscillator 46 with defined word width
64 second output signal of the ramp oscillator 46 (reference: dto_co or dto_carry_out), in particular carry-out signal or overflow pulse of the ramp oscillator 46
66 signal for initializing and resetting the circuit arrangement 106 in the basic state (reference: reset)
68 output signal of the edge detector 78, in particular pulse (so-called "one clock cycle") following a detected rising edge of the input signals 50' (reference: w[ord]s[elect]_det[ect])
70 splitter unit, in particular signal splitter
72 digital-to-time converter DTC
74 analog phase locked loop=analog PLL
76 frequency generator (reference: I/n), in particular frequency splitter
78 edge detector
782 first flip-flop unit (reference: w[ord]s[elect]_det[ect]_in)
784 second flip-flop unit (reference: w[ord]s[elect]_det[ect]_buf[fer])
786 AND gate
788 first flip-flop unit (reference: w[ord]s[elect]_det[ect])
80 digital output signal (reference: dto_overflow)
82 analog, in particular time-dependent, output signal
82' output signal of the digital-to-time converter 72
84 output signal of the analog phase locked loop
86a first output signal of the circuit arrangement 100 (reference: clk54, wherein there is no identity with the reference clk54 of the system clock 52)
86a' first output signal of the circuit arrangement 106 (reference: 0:5 FS)
86b second output signal of the circuit arrangement 100 (reference: clk27)
86b' second output signal of the circuit arrangement 106 (reference: 1 FS)
86c third output signal of the circuit arrangement 100 (reference: clk13M5)
86c' third output signal of the circuit arrangement 106 (reference: 32 FS)

86d fourth output signal of the circuit arrangement 100 (reference: hd)
86d' fourth output signal of the circuit arrangement 106 (reference: 64 FS)
86e' fifth output signal of the circuit arrangement 106 (reference: 128 FS)
88 gain factor of the frequency detector 48 (reference: kif)
90 switching signal (reference: phasedet_sel)
92 first switching element
92a output signal of the first switching element 92
94 second switching element
94a1 first output signal of the second switching element 94
94a2 second output signal of the second switching element 94
96 first register element
96a output signal of the first register element 96
96i input (signal) of the first register element 96
98 second register element
98a output signal of the second register element 98
98i input (signal) of the second register element 98
CS cycle slip of two signals with respect to one another
dto_max maximum value of the ramp oscillator 46
DTO_reg register of the ramp oscillator 46
f frequency
$f_{clk}$ frequency of the clock signal 52
$f_{DTO}$ frequency of the ramp oscillator 46
$\Delta f_s$ last small (frequency) step
$f_z$ target frequency
h(s) transfer function, in particular phase transfer function
ha input phase
$K_D$ steepness of the phase detector 44
$K_i$ integral coefficient of the integral element 306=integral factor of the integral element 306
$K_O$ steepness of the ramp oscillator 46
$K_p$ proportional coefficient of the first proportional element 300 and of the second proportional element 304=proportional factor of the first proportional element 300 and of the second proportional element 304
R reset of the counter content slip_cnt of the cycle slip counter to slip_cnt=0
s variable in Laplace transformation
slip_cnt counter content of the cycle slip counter of the frequency detector 48
t time
T period duration of the input signal 50
$T_{DTO}$ period duration of the ramp oscillator 46
ξ damping, in particular damping factor or damping constant
φ-clock early value=time interval between the last clock prior to an overflow and the end of a virtual period of the ramp oscillator 46
$\omega_n/2\pi$ natural (loop) frequency

The invention claimed is:

1. A circuit arrangement having at least one phase locked loop comprising:
at least one phase detector for detecting phase information of at least one analog input signal following the arrival of at least one rising edge and/or falling edge of at least one analog input signal;
at least one loop filter to which the output signal which is output by the phase detector is be fed, for determining at least one increment;
at least one ramp oscillator to which the increment which is output by the loop filter is be fed, characterized in that the phase locked loop comprises at least one time-to-digital converter to which at least one system clock is fed, for digitizing the input signal in particular the phase of the input signal;
wherein the phase detector is fed the output signal, including additional phase information, of the time-to-digital converter and also at least a first output signal in particular at least one status signal, of the ramp oscillator; and
at least one frequency detector is fed at least a second output signal in particular at least one overflow pulse of the ramp oscillator and outputs frequency information to the loop filter which is assigned to at least one frequency locked loop.

2. A circuit arrangement as claimed in claim 1 wherein at least one splitter unit in particular signal splitter, which is fed:
the increment of the loop filter;
the first output signal of the ramp oscillator; and
the second output signal of the ramp oscillator determines there from at least one digital output signal in particular the digital phase of at least one digital output signal;
wherein at least one digital-to-time converter which is fed the second output signal of the ramp oscillator converts the digital output signal into at least one analog, in particular time-dependent, output signal.

3. A circuit arrangement as claimed in claim 1, characterized in that at least one analog phase locked loop in particular for multiplying the output frequency, is connected downstream of the digital-to-time converter; and
the output signal of the analog phase locked loop passes to at least one frequency generator in particular to at least one frequency splitter, in order to generate at least one output signal of the circuit arrangement.

4. A circuit arrangement as claimed in claim 3, characterized in that the phase locked loop has at least a second phase detector which is fed the first output signal of the ramp oscillator and at least one output signal of the output signals sent out by the frequency generator; and
wherein at least a fourth adder connected between the first phase detector and the loop filter for adding the output signal of the first phase detector to the in particular negative output signal of the second phase detector.

5. A circuit arrangement as claimed in claim 4, characterized in that the phase locked loop has at least a second time-to-digital converter which is fed the output signal of the frequency generator and the output signal of which is fed to the second phase detector.

6. A circuit arrangement as claimed in claim 3, characterized by at least a first switching element connected upstream of the time-to-digital converter and the phase detector the output signal of which first switching element is switched as a function of at least one switching signal between the input signal and at least one output signal of the output signals sent out by the frequency generator;
at least a second switching element connected between the phase detector and at least a first register element assigned to the input signal and at least a second register element assigned to the output signal of the frequency generator; and
at least a fourth adder connected upstream of the loop filter for adding the output signal of the first register element to the in particular negative output signal of the second register element;
wherein as a function of the switching signal the input of the first register element or the input of the second register element is fed the output signal of the phase detector by the second switching element;
as a function of the negated switching signal the first input of the fourth adder is fed the first output signal of the second switching element by the first register element; and as a function of the switching signal the second input of the fourth adder is fed the second output signal of the second switching element by the second register element.

7. A circuit arrangement as claimed in claim 1, characterized in that the frequency locked loop has at least one increment module in particular at least one increment generation unit, and
at least one adaptation unit is connected between the increment module and the loop filter which adaptation unit is fed the increment which is output by the loop filter is designed to provide at least one adaptive algorithm and outputs at least one output signal.

8. A circuit arrangement as claimed in claim 1, characterized in that the loop filter comprises:
at least a first proportional element for multiplying the output signal of the phase detector by at least one proportional coefficient or proportional factor;
at least one proportional path;
at least one integral path and;
at least a first adder for adding the output signal of the proportional path to the output signal of the integral path;
wherein the integral path has:
at least a second proportional element for multiplying the output signal of the first proportional element by the proportional coefficient or proportional factor
at least one integral element for multiplying the output signal of the second proportional element by an integral coefficient or integral factor; and
at least one integrator intended to integrate the output signal of the integral element said integrator having:
at least a third adder for adding the output signal of the integral element to the output signal of the frequency detector and to the fed-back output signal of the integrator;
at least one integral value limiter for limiting the output signal of the third adder, and
at least one delay element.

9. A circuit arrangement as claimed in claim 1, characterized in that the output signal of the first adder is formed as a function of the respective operating mode of the phase locked loop by feeding to the integral path the output signal of the adaptation unit while at the same time feeding to the proportional path at least one vanishing signal;
at least one frequency limiter for limiting the frequency of the output signal of the first adder is connected downstream of the first adder; and
at least a second adder for adding the output signal of the frequency limiter to at least one nominal increment signal is connected downstream of the frequency limiter.

10. A method of locking onto and/or processing audio, television and/or video data, by means of at least one phase locked loop, the method comprising:
detecting phase information by means of at least one phase detector following the arrival of at least one rising edge and/or falling edge of at least one analog input signal;
determining at least one using at least one loop filter to which the output signal which is output by the phase detector is fed; and
communicating an increment to at least one ramp oscillator is fed the increment which is output by the loop filter;
wherein the phase locked loop is essentially digital, wherein the input signal in particular the phase of the input signal is digitized by means of at least one time-to-digital converter to which at least one system clock is fed;
the phase detector is fed the output signal in particular the additional phase information, of the time-to-digital converter and also at least a first output signal in particular at least one status signal, of the ramp oscillator; and
at least one frequency detector is fed at least a second output signal in particular at least one overflow pulse, of the ramp oscillator and outputs frequency information to the loop fitter which in particular is also assigned to at least one frequency locked loop.

11. The method as claimed in claim 10, further comprising:
communicating to at least one splitter unit comprising a signal splitter the increment of the loop filter; the first output signal of the ramp oscillator; and the second output signal of the ramp oscillator;
determining from the increment, the first output signal of the ramp oscillator, and the second output signal of the ramp oscillator at least one digital output signal in particular the digital phase of at least one digital output signal;
communicating to at least one digital-to-time converter the second output signal of the ramp oscillator;
converting the digital output signal into at least one analog time-dependent output signal;
multiplying the output frequency using of at least one analog phase locked loop which is connected downstream of the digital-to-time converter; and
communicating the output signal of the analog phase locked loop to at least one frequency generator comprising at least one frequency splitter, in order to generate at least one output signal of the circuit arrangement.

12. The method as claimed in claim 11, characterized in that phase information of at least one output signal of the output signals sent out by the frequency generator is determined and output by at least a second phase detector as an in particular negative output signal; and
the output signal of the first phase detector is added to the in particular negative output signal of the second phase detector by at least a fourth adder.

13. The method as claimed in claim 12, characterized in that, in the event of insufficient accuracy of a system clock period as maximum phase offset between the input signal and the output signal of the frequency generator there is assigned to the phase locked loop at least a second time-to-digital converter which is fed the output signal of the frequency generator and the output signal of which is fed to the second phase detector.

14. The method as claimed in claim 11 further comprising:
switching an output signal of at least a first switching element between the input signal and at least one output signal of the output signals sent out by the frequency generator as a function of at least one switching signal;
communicating to the phase detector the output signal of the first switching element;
assigning as a function of the switching signal at least a first register element the input signal to at least a first register element;
assigning the output signal of the frequency generator to at least a second register element;
communicating the output signal of the phase detector to either the first register element or the second register element by at least a second switching element;
communicating to at least a fourth adder, as a function of the negated switching signal, the first output signal of the second switching element;

communicating to the fourth adder, as a function of the switching signal, the second output signal of the second switching element; and adding the output signal of the first register element to the negative output signal of the second register element.

15. The method as claimed in claim 10, characterized in that, in the frequency locked loop at least one adaptation unit provides at least one adaptive algorithm and outputs at least one output signal said adaptation unit being fed the increment which is output by the loop filter and being connected between at least one increment module in particular at least one increment generation unit, and the loop filter.

* * * * *